US005881221A

United States Patent [19]

Hoang et al.

[11] Patent Number: 5,881,221
[45] Date of Patent: Mar. 9, 1999

[54] DRIVER LEVEL DIAGNOSTICS

[75] Inventors: Thanh V. Hoang, Sugar Land; Paul Fontenot, Houston, both of Tex.

[73] Assignee: Compaq Computer Corporation, Houston, Tex.

[21] Appl. No.: 777,663

[22] Filed: Dec. 31, 1996

[51] Int. Cl.[6] .................................................. G06F 11/25
[52] U.S. Cl. .............................. 395/183.18; 395/183.14; 371/21.1
[58] Field of Search ........................ 395/183.01, 183.18, 395/182.22; 371/25.1, 40.1, 21.1, 22.33

[56] References Cited

U.S. PATENT DOCUMENTS

| | | | |
|---|---|---|---|
| 4,057,847 | 11/1977 | Lowell et al. | 395/183.22 |
| 4,823,343 | 4/1989 | Takahashi | 395/183.22 |
| 4,837,764 | 6/1989 | Russello | 395/183.08 |
| 5,021,997 | 6/1991 | Archie et al. | 395/183.07 |
| 5,124,622 | 6/1992 | Kawamura et al. | 318/569 |
| 5,157,782 | 10/1992 | Tuttle et al. | 395/183.21 |
| 5,367,667 | 11/1994 | Wahlquist et al. | 395/183.22 |
| 5,371,883 | 12/1994 | Gross et al. | 395/183.14 |
| 5,388,252 | 2/1995 | Dreste et al. | 395/183.22 |
| 5,390,324 | 2/1995 | Burckhartt et al. | 395/185.08 |
| 5,455,933 | 10/1995 | Schieve et al. | 395/183.2 |
| 5,513,319 | 4/1996 | Finch et al. | 395/185.08 |
| 5,579,527 | 11/1996 | Chin et al. | 371/25.1 |
| 5,602,990 | 2/1997 | Leete | 395/183.01 |
| 5,629,878 | 5/1997 | Kobrosly | 395/183.01 |
| 5,720,030 | 2/1998 | Kamihara et al. | 395/183.18 |
| 5,720,031 | 2/1998 | Lindsay | 395/183.18 |
| 5,724,273 | 3/1998 | Desgrousilliers et al. | 395/183.14 |

*Primary Examiner*—Robert W. Beausoliel, Jr.
*Assistant Examiner*—Pierre E. Elisca
*Attorney, Agent, or Firm*—Pravel, Hewitt & Kimball

[57] ABSTRACT

An apparatus and method are disclosed for testing memory and display adapter components of a multi-tasking computer system. The apparatus obtains a memory block and sends a request to a memory virtual device driver (VxD) to reserve, commit and lock the memory block to a physical memory. In requesting the memory block, the apparatus computes the number of virtual memory pages spanned by the request, reserves the pages of virtual memory, commits the virtual memory to a physical memory, and locks the virtual memory to the physical memory. The apparatus then obtains a physical address for the physical memory and returns the physical address for testing. Next, the apparatus tests the memory block using a number of memory test procedures. After the testing completes, the apparatus decommits and unlocks the physical memory before it traverses to the next entry of the chain. This process is repeated until all entries in the virtual memory chain have been tested. The apparatus also tests the video memory by generating a pattern, writing the pattern to the video memory; reading the content of the video memory and comparing the pattern against the content of the video memory. In the event that the content of the video memory differs from the pattern, the apparatus indicates a defective video display adapter and otherwise indicates a good video display adapter.

39 Claims, 28 Drawing Sheets

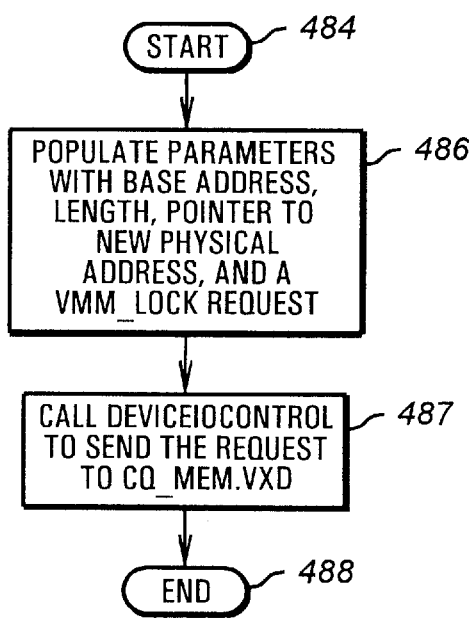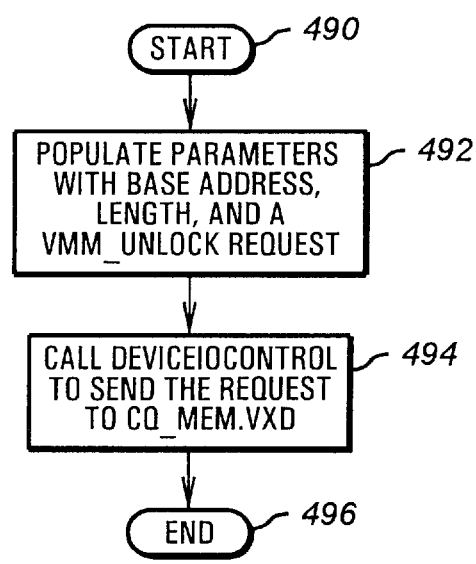
*FIG. 10*    *FIG. 11*

DRIVER LEVEL DIAGNOSTICS

CROSS-REFERENCE TO RELATED APPLICATIONS

The following disclosures are hereby incorporated by reference:

U.S. application Ser. No. 08/774,808, commonly assigned and concurrently filed on Dec. 31, 1996, entitled "MULTI-TASKABLE DIAGNOSTICS MODULE," by Harsany et al.

U.S. application Ser. No. 08/777,902, commonly assigned and concurrently filed on Dec. 31, 1996, entitled "DIAGNOSTICS MODULE DISPATCHER," by Perugini et al.; and U.S. application Ser. No. 08/775,778, commonly assigned and concurrently filed on Dec. 31, 1996, entitled "TEST DEFINITION TOOL," by Venkins et al.

BACKGROUND OF THE INVENTION

1. Field of the Invention

The present invention is directed in general to diagnostics for a computer system, and more specifically, to diagnostics for memory and display systems in the computer system.

2. Description of the Related Art

The continual reduction in size and cost of personal computers has been instrumental in the rapid acceptance of computer technology by corporations and consumers. Even with ultra large scale integration technology, which reduces the number of components in personal computers, these personal computers are still highly complex hardware assemblies. Thus, even computers assembled using high quality components and careful assembly procedures are still subject to occasional manufacturing defects and failures during use.

The costs associated with such defects and failures in terms of manufacturer warranty obligations and end user down time are relatively high. Hence, prior to the delivery of the computers to end users following the manufacture or subsequent repair, the computer circuit boards are normally subjected to functional tests to determine whether they operate properly. Furthermore, during use, the user may experience problems relating to either hardware problems or improper software configurations. To isolate the fault, the user may wish to subject his or her computer system to the functional tests to satisfy the user that the hardware or driver level software is not the culprit of the problems.

One type of diagnostic program is embedded into a non-volatile memory of the computer. In an IBM compatible personal computer, the test is called "Power On Self Test" (POST) and is arranged in personal computers as a portion of the basic input/output system (BIOS). Such BIOS-POST diagnostic program is executed automatically and mandatorily when the computer system boots. One problem that occurs with the placement of test codes in the BIOS-POST diagnostic program is the execution speed and the size of the actual code. First, users do not want to wait for an extensive diagnostic testing during each boot. Therefore, the POST-diagnostics routines cannot be as sophisticated and as thorough as possible. Furthermore, the POST diagnostics routine is constrained by very tight memory requirements, and therefore is limited to very simple and time-efficient tests without an easy to use graphical user interface inherently present in the Windows interface.

Another functional testing method deploys specialized diagnostics software which is transferred to the computer system under test via one or more disks. The testing software is typically loaded onto the computer to be tested and a technician or a user initiates the execution of the software for testing the computer. The diagnostic software is designed to test the operation and interconnection of the circuit board components and other hardware, and to provide graphic displays on the monitor indicating the nature of any identified faults. Diagnostic software of this type is commercially available for most computer system manufacturers and original equipment manufacturers. Additionally, after-market diagnostic software is also commercially available from independent software vendors. Unfortunately, these diagnostic software test procedures are relatively inefficient and time consuming for the user or technician to perform. These test procedures are also somewhat inaccurate since they generally do not stimulate the full range of operating environments in which the computers are exposed during operation by the end users. Thus, latent and intermittent faults can be especially difficult to detect using these test procedures.

Typically, each major portion of the computer is tested. In a modem personal computer, these portions include a microprocessor, a memory system, data storage devices, and input/output (I/O) devices such as a display, a keyboard, a mouse, and communication devices, among others. One important component for the computer is the processor, for the processor determines the processing capability of the computer. Another important component is the memory system. Typically, the memory capacity of a modem personal computer is in the range of 16 to 64 megabytes of data and is implemented using a plurality of single or dual-in-line memory modules (SIMMs or DIMMs). DIMMs are replaceable snap-in/snap-out components designed to allow computer users to replace or increase computer memory. The DIMMs typically comprise a small circuit board to which are attached one or two banks of dynamic random access memory (DRAM) chips. The DRAM chips contain the memory cells which are used for storage. The size of the DIMM varies, and is dependent upon the number and the size of the DRAMs used to construct them on the small circuit board.

Due to the large data capacity offered by current DRAM technology, the risk of memory failure can be high. As can be appreciated, a memory fault which results in a data error within a portion of the memory address space must be accurately identified and avoided. Historically, memory diagnostics programs are used to detect and identify faults or errors in memory subsystems of computers upon boot-up of the computers. These memory diagnostics programs test memory by writing specific data patterns to memory and then reading back these patterns for verification. These memory diagnostics programs generate specific patterns and write these patterns to the memory over whatever data is currently present in memory. This read/write testing process is referred to as destructive testing because it destroys the content of the memory being tested. The destructive testing process is not problematic as long as the computer is being booted-up or, after booting-up, the operating system of the computer under test executes only the test software. However, in multi-tasking systems such as Windows-95, many other processes may be running at the same time and may occupy the region of memory being tested. The destructive testing is unacceptable, because it also stops the other processes that may require access to the memory. Furthermore, it is difficult to perform the memory test in multi-tasking operating systems such as the Windows-95 environment because Windows-95 swaps memory in and out of swap files to optimize memory usage. In addition, Windows-95 also moves memory segments around to make room for other memory allocation, as necessary. To further complicate matters, when requesting memory for tests through allocation in conventional manner, the operating system only returns a pointer to the memory buffer available at the time of the request. Thus, the traditional memory allocation technique does not allow the user to specify the exact base memory address at which memory is to be allocated for testing purposes. For these reasons, the process of testing memory in a multi-tasking environment is particularly challenging. Nonetheless, the ability to perform diagnostics in a multi-tasking environment improves the efficiency of the computer system because the diagnostics can proceed in parallel with other tasks. This ability is especially helpful given the large memory capacity of the modern computer and the correspondingly longer testing periods.

Another significant component of the computer system is the component for delivering a visual interface for the user. This is normally performed by the video graphics adapter. Typically, the graphics adapter has a cathode ray tube controller (CRTC) which supervises the functions of the adapter. The CRTC is connected to a video RAM which stores the text or graphics the monitor is to display. The video RAM and the character ROM or RAM is provided to a character generator controlled by the CRTC for rasterizing character data into a bit-map. In one mode, the output of the character generator is provided to a shift register which serializes the bitmap and converts the serial data stream into suitable video signals. Furthermore, to improve the graphics rendering speed and to reduce the load on the processor, the graphics adapter can include its own graphics processor, or accelerator, to render lines, circles and other geometric shapes by itself.

Although the availability of higher capacity video RAM and accelerator devices improves the performance of the graphics system, the presence of these components also increases the complexity of the testing process. The assembly lines of the computer manufacturing plant use human operators to perform the quality check on the monitors. Although the subjective process or checking the quality of the display adapters driving the monitors is relatively simple, the manual verification of the quality of numerous display adapters driving the monitors can be monotonous. Thus, the human operators who assemble and test the display system of the computer can be lulled into a mode where they simply pass every display system assigned to them for quality assurance. Hence, a problem exists in ensuring that the assembly operators are actually checking each display adapter through the associated display monitor. Thus, what is needed is a method for prompting operators at the manufacturing plant to verify the functionality of each video adapter and the monitor the adapter drives.

In sum, users are demanding that their computer be reliable and be available at virtually any time. Computers, however, can experience problems associated with any one of their major components, such as the hard drive, the display, the memory, and the processor. It is important, therefore, to provide a diagnostic capability for the computer system that can test the operation of the computer in a multi-tasking environment to closely simulate the actual environment that the computer system operates in.

SUMMARY OF THE INVENTION

An apparatus and method are provided to test a memory array and a video adapter portion of a multi-tasking computer system. During the testing of the memory, the apparatus first obtains a memory block and sends a request to a memory virtual device driver (VxD) to reserve, commit and lock the memory block to a physical memory. In requesting the memory block or virtual memory chain, the apparatus computes the number of virtual memory pages spanned by the request; reserves the pages of virtual memory, commits the virtual memory to a physical memory, and locks the virtual memory to the physical memory. The apparatus then obtains a physical address for the physical memory and returns the physical address for testing. Next, the apparatus tests the memory block using a number of memory test procedures. After the testing completes, the apparatus decommits and unlocks the physical memory before it traverses to the next entry of the chain. This process is repeated until all testable entries in the virtual memory chain have been tested.

The apparatus also tests the video memory by generating a pattern, writing the pattern to the video memory; reading the content of the video memory and comparing the pattern against the content of the video memory. In the event that the content of the video memory differs from the pattern, the apparatus indicates a defective video display adapter and otherwise indicates a good video display adapter.

Thus, the present invention provides a cost effective and rapid system for testing main memory. Furthermore, the present invention provides an effective system for testing various aspects of the video display adapter portion of the computer system under test.

BRIEF DESCRIPTION OF THE DRAWINGS

A better understanding of the present invention can be obtained when the following detailed description of the preferred embodiment is considered in conjunction with the following drawings, in which:

FIG. 10 is a flowchart illustrating in detail the interface to the virtual lock routine of FIG. 8B;

FIG. 11 is a flowchart illustrating in detail the interface to the virtual unlock routine of FIG. 9A;

DETAILED DESCRIPTION OF THE PREFERRED EMBODIMENT

Figure 1:
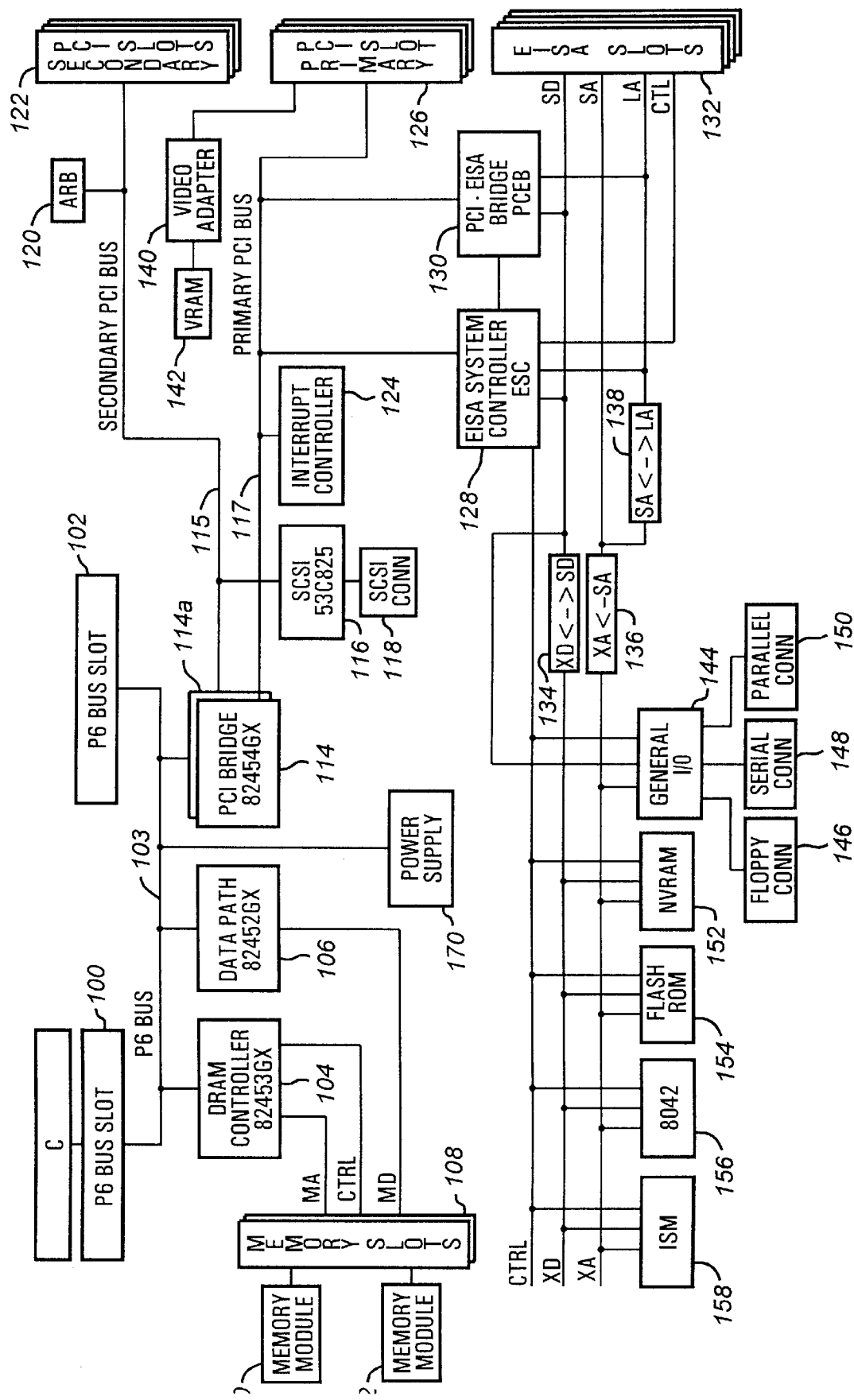
FIG. 1 is a schematic illustration of a computer system executing a Diagnostics for Windows software in accordance with the present invention.

Turning now to the drawings, a computer system S is disclosed in FIG. 1. The computer system S of FIG. 1 deploys one or more processors such as the Pentium Pro™ processor available from Intel Corporation located in Santa Clara, Calif. The Pentium Pro™ processors reside on a processor card C which is plugged into one of two P6 slots 100–102. The P6 slots 100–102 are connected to a 72-pin Pentium Pro™ host bus called the P6 bus 103. The P6 bus 103 is a high performance bus which can support two processor cards mounted on slots 100–102. Each processor card C supports two Pentium PrO™ processors.

In addition to the processors, the P6 bus 103 is connected to a memory controller 104 and a data path device 106 which collectively form a DRAM control subsystem. The illustrated DRAM controller is an 82453GX and the data path device 106 is an 82452GX, both of which are available from Intel Corporation.

The DRAM controller 104 provides control and timing to the memory subsystem, while the data path device 106 interfaces the 72-bit P6 host bus to the memory array. The memory controller 104 and the data path 106 are capable of taking a memory request from the CPU, queuing it, and responding after the requested operation has completed. Additionally, the controller 104 provides memory error correction which is vital in error-free applications, including the capability of single- bit error correction and multi-bit error detection on the fly. The memory controller 104 can handle up to four gigabytes of page mode DRAM. Memory arrangements having non-interleaved, x2 and x4 interleaving configurations are supported by the memory control sub-system.

A plurality of memory modules 110–112 are connected to memory slots 108 to provide up to four gigabytes of memory. These modules often have a standard width of 9 bits, with a relevant number of times 1 or times 4 chips, allocated to reach the indicated storage capacity, such as one megabyte, four megabytes or 16 megabytes. Thus, a 1M×9 module may comprise nine 1 Mb chips with the organization of 1 Mb×1, or two four-megabyte chips with the organization of 1 Mb×9 for data, as well as one megabit chip with the organization of 1 Mb×1 for parity information. The SIMM modules must be inserted into the intended sockets of the banks. Internally, the modules often combine pair by pair or four by four to realize a main memory with a data width of 16 or 32 bits. Thus, SIMM modules offer versatility in configuring the computer memory and are available in individual sizes from one megabyte to 64 megabytes per SIMM. Further, DIMMs or other memory technology can be used.

The CPU stores data and programs in the RAM. Accesses to the data and programs are accomplished by instructing the memory which data the CPU needs prior to sending the memory an address, akin to a "house number" of the data unit requested. The address information is provided from the CPU by an address bus, and the transfer of data from the RAM to the CPU is performed using a data bus. Generally, in computer terms, a bus means a number of lines through which related data and signals are transferred. The address bus consists of 32-bit address lines in the case of 386, 486 or Pentium processors. The data bus for these processors is also 32-bits in width. During operation, the actual performance of the memory subsystem will depend in part on the mix of read and write operations and the memory access patterns for a given application. The controller 104 minimizes the impact of the idle cycles by allowing read operations to bypass the write operations and be completed first as long as the memory addresses for the read/write pair do not match.

In addition to the memory controllers, a robust input/output system is needed for the computer system S. Two PCI buses provide a 115 and 117 combination of high performance and scalable I/O for the demanding environment faced in high performance applications. To provide PCI connections, one or more PCI bridges 114 are connected to the P6 bus 103. The peer-to-peer arrangement of the PCI buses eliminates one or more levels of arbitration present in the hierarchical arrangement, resulting in higher system performance.

As in the DRAM controller 104, the PCI bridge 114 supports a full 64-bit interface to the CPU bus, including support for all protocols as well as error correction. The PCI bridge 114 supports an 8-deep transaction in-order queue as well as separate 4-deep queues for both outbound (processor to PCI) and inbound (PCI to processor) transactions that are for the I/O bus agent. Also, like the DRAM controller 104, the PCI bridge 114 provides four 32-byte data buffers in both the inbound and outbound directions.

Attached to the secondary PCI bus 115 is a SCSI disk controller 116. The SCSI controller 116 provides the capability of handling simultaneous disk commands which is necessary in a multi-threaded, multi-tasking operating system. The illustrated SCSI controller 116 is a 53C825 available from NCR Corporation. Attached to the 53C825 is one or more SCSI connectors 118 which drives a plurality of disk drives adapted to support the host system's simultaneous issuance of multiple commands to one or more SCSI devices. In addition to the SCSI controller 116, a plurality of devices may be plugged into the secondary PCI bus 115 over a plurality of secondary PCI slots 122.

On the primary PCI bus 117, an interrupt controller 124 handles interrupt requests coming into the PCI bridge 114 for eventual transmission to one of the processors in slots 100–102. The interrupt controller 124 routes interrupt requests from devices located on PCI buses 115–117 to the processors on slots 100–102 during multiprocessor operation. Additionally, a number of PCI peripherals may be plugged into a plurality of primary PCI slots 126.

An EISA system controller (ESC) 128, preferably the Intel 82374EB device, and a PCI-EISA bridge (PCEB) 130, preferably the Intel 82375EB, are also connected to the primary PCI bus 117. The ESC 128 and the PCEB 130 work in tandem to provide an EISA I/O subsystem interface for the computer system S. The combination of the ESC 128 and the PCEB 130 provides an I/O subsystem capable of taking advantage of the power of the PCI bus architecture while maintaining access to a large base of EISA and ISA expansion cards, and the corresponding software applications.

The ESC 128 and the PCEB 130 are connected to a plurality of EISA slots 132. Additionally, the ESC 128 also generates chip selects for certain functions that typically reside on an X bus. The ESC 128 generates chip select signals from an integrated system management unit (ISM) 158, a keyboard controller 156, a flash ROM 154, a non-volatile RAM 152, and a general purpose I/O device 144 which supports floppy drives, serial ports, and parallel ports over floppy connectors 146, serial connectors 148, and parallel connectors 150.

A video controller or adapter 140 is connected to the PCI bus 126. The video controller 140 is connected to a video RAM 142 which is 512 kilobytes in size. Turning now to hardware details on the video display system, video information is typically generated via the graphics adapter 140. In general, four main types of graphic adapters are commonly used in personal computers. The older graphics adapters include CGA for color graphics adapter which has a resolution of 300×200 four color screen or 640×200 two color screen. Yet another class of display called multicolor graphics array (MCGA) is available. The MCGA is essentially an analog superset of the CGA. Next in line in the evolution of display standard is an enhanced graphics adapter (EGA). The EGA adapter provides the 320×200 four color and the 600×200 two color modes of the CGA, in addition to the four EGA graphics mode. Currently, the graphics standard in personal computing is called video graphics array (VGA). The VGA adapter provides all modes of EGA, CGA and MCGA graphics, as well as one additional graphics modes: a 640×480 sixteen color mode. The VGA adapter works with either an analog display monitor or a multi-scan monitor. An extension of the VGA standard is known as a super VGA (SVGA) which supports a resolution of 1280×1024 dots and up to sixteen million colors. Generally, the VGA graphics adapter stores separate graphic images or bit planes in display memory. Each bit plane stores the complete image of one of the four primary color codes used by the VGA and the EGA: red, green, blue and, in case of EGA, intensity level. The display control of the VGA and EGA simultaneously reads the corresponding bits from all bit planes and uses the aggregate to determine which of the available colors should be displayed at that location on the display screen.

Turning now to the display memory, on graphics adapters with a video RAM up to 128 kbytes, the display memory appears to the CPU as the normal main memory. But if the video RAM is larger, it would overlap ROM extensions at address C0000h. Furthermore, the video RAM of most adapters is much larger than a single screen page. On an EGA or (S)VGA graphics card in text mode the video RAM is divided into pages, each of which can accommodate a whole screen page. The size of the pages depends upon the screen mode and the maximum number of pages, plus, of course, the size of the video RAM. Thus, EGA and (S)VGA boards with more than 128 kbytes of display RAM provides a bank-switching capability that can be set by software to access various 128 kbyte windows into the much larger video RAM.

In text mode the video RAM is regarded as a linear array; the first word is assigned the character in the upper left corner, that is, the character in row one, column one. The second word then describes the character in row one, column two, and so on. Depending upon the text resolution, a varying amount of memory is necessary to accommodate the whole screen's contents. In addition to the text mode, the graphics adapter can also be placed in a graphics mode, a standard mode of operation in a Windows environment. For graphics display, the program must write appropriate values to the corresponding locations in the display memory. A line, for example, is represented by a plurality of identical bit groups or bytes in the video RAM. Depending upon the number of displayable colors, one pixel on the monitor is assigned more or fewer bits. Monochrome graphics requires only a single bit corresponding to bright (bit=1) or dark (bit=0) per pixel. Multicolor graphics usually assign several bits per pixel; on a VGA with 256 different colors, eight bits or one byte per pixel is required. Predictably, the storage capacity of the video RAM must increase rapidly with increasing resolution and the rising number of colors in the pictures. This progression toward larger main memory and higher resolution display system has made testing and verification of the computer hardware more complex. The complexity of the hardware testing process is resolved in part by a Diagnostics for Windows (DFW) software of the present invention.

Figure 2:
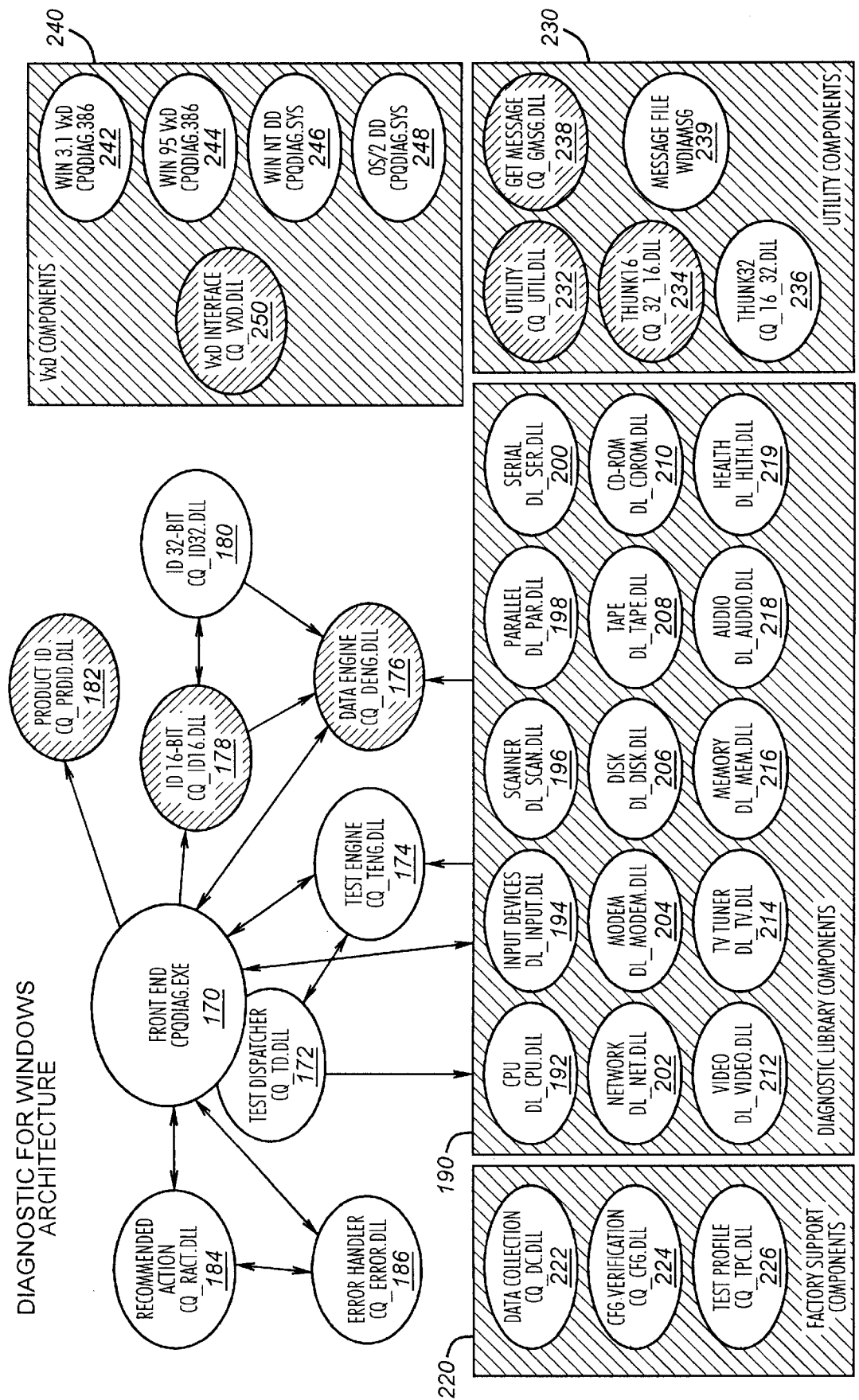
FIG. 2 is a diagram illustrating in more detail components of the Diagnostics for Windows software in accordance with the present invention.

Turning now to FIG. 2, the interaction between the various modules of the Diagnostics for Windows (DFW) architecture is shown. The high level operation of this software is further described in the copending U.S. patent application having Ser. No. 08/774,808, entitled "MULTI-TASKABLE DIAGNOSTICS MODULE," previously incorporated by reference, but is summarized below.

In FIG. 2, a front end module 170 is provided as a main program and user interface. The front end module 170 initializes the DFW and verifies that all of the DLLs are valid. Furthermore, the front end 170 is responsible for all user interactions and interface functionalities. The front end 170 communicates with a test dispatcher 172. The test dispatcher 172 is responsible for dispatching diagnostic tests, managing test threads, and other aspects relating to the management of the system tests. The front end 170 and the test dispatcher 172 further communicate with a test engine 174 which is a depository of all diagnostic test information. The test engine 174 determines which tests are valid, as gathered from various diagnostic libraries (DLs 190). The front end 170 uses the depository in the test engine 174 to determine which diagnostics test to run.

The front end 170 also communicates with a data engine 176. The data engine 176 is a depository for all system inspection information as gathered by the product identification and the diagnostic libraries. The front end 170 uses the depository in the data engine 176 to report inspection information to the user. Additionally, the front end 170 also communicates with a 16-bit ID module 178 which in turn drives the data engine 176. The 16-bit ID unit 178 inspects relevant hardware/firmware/software information in the computer, and is responsible for gathering all of the information relating to 16-bit peripheral type. The 16-bit ID module 178 in turn communicates with a 32-bit ID module 180. The 32-bit ID module 180 further communicates with the data engine 176 for reporting relevant hardware/firmware/software information not gathered by the 16-bit ID module 178. In combination, the 16-bit ID module 178 and the 32-bit ID module 180 gathers information such as product, processor and speed, serial numbers, and others for asset control and identification purposes. Furthermore, the 16-bit ID module 178 and 32-bit ID module 180 gathers the user's preferences such as power management and security preferences. Additionally, the modules 178 and 180 are responsible for gathering all operating system related information for both DOS and Windows operating systems. The modules 178 and 180 also gather architectural information such as the type of expansion bus (ISA, EISA, PCMCIA, PnP and PCI) and miscellaneous information such as from the CMOS and NVRAM, among other things.

The front end module 170 also communicates with a product ID module 182 which identifies the product currently being tested. The product ID module 182 also sets the product name and processor speed and initializes the internal tables and variables for the DFW program. Additionally, the front end 170 communicates with a recommended action module 184, which is a simplified expert system to display to the user recommended choices for recovering from errors reported during testing. The recommended module 184 and the front end module 170 also communicate with an error handler 186, which is a depository of all error information. The error handler 186 is responsible for reporting errors to the user including both the error code and the recommended actions, as provided by the recommended action module 184.

Turning now to the diagnostic library (DL) components 190, the Diagnostics for Windows architecture further provides a plurality of diagnostic library components 192–219. A CPU DL 192 provides a diagnostic library routine which is responsible for testing the processor and the cache. The DL library components also include an input device diagnostic library 194 which is responsible for testing the keyboard, the mouse, track ball, and game port devices. Furthermore, a scanner diagnostic library 196 is provided for testing scanner devices. Additionally a parallel diagnostic library 198 is provided to test the functionality of the parallel port. Similarly, a serial diagnostic library 200 is provided to test one or more serial ports connected to the computer system S.

In the diagnostic library components 190, a network diagnostic library 202 is provided to test the network card devices (NCD). Additionally, a modem diagnostic library 204 is provided to test a modem which is connected to the computer system S. Furthermore, a disk diagnostic library 206 is provided to test the diskette and hard disk drives for the computer system S. Similarly, a tape diagnostic library 208 is provided to test tape drives connected to the computer system S. A compact disk read only memory (CD-ROM) diagnostic library 210 is provided to test the functionality of the CD-ROM drive of the computer system S. Furthermore, the diagnostic library includes a video diagnostic library 212 for testing the functionality of the display system of the computer of the present invention. A tuner diagnostic library 214 is provided to test the multimedia component of the computer system S of the present invention. Additionally, a memory diagnostic library 216 is provided to test the main memory array for the computer system S. An audio diagnostic library 218 is provided to test the speaker and microphone connected to the computer S of the present invention. A health diagnostic library 219 is provided to diagnose the system health software and hardware and to report all of the information, including the health logs and the client management, among others, to the user.

A factory support components 220 is also provided generally for manufacturing and assembly related processes. A data collection module 222 is provided to provided to report test information such as pass or fail, and error code, among others in the factory testing process. The data collection module 222 comprehends the network and database schemes in the factory for recording this information. Additionally, a configuration verification module 224 is provided for verifying that the system has been built according to the bill of material (BOM). Thus, the configuration verification module 224 verifies that the computer under test has the correct hardware, software and firmware as needed. Furthermore, the factory support component 220 has a test profile configuration module 226 which is responsible for reading the test profile configuration file produced by the test definition tool (TDT) and converting the configuration file into a form usable by the test dispatcher 172.

Turning now to the utility components 230, utility components 230 contains a plurality of modules, including generally a utility 232, a Thunk_16 234, a Thunk_32 236, a get message module 238 and a message file 239. The utility 232 provides support code shared by the rest of the DFW software. The thunk files 234 and 236 are codes that handle transitions to and from 16-bit and 32-bit code. The get message module 238 and the message file 239 support communications among modules.

Additionally the Diagnostic for Windows software contains a plurality of VxD components 240. A VxD can be a Virtual Device Driver used to virtualize a particular hardware device among multiple programs that use it. A VxD is essentially a DLL that runs at the highest privilege level of the processor, or ring 0. The VxD components 240 has a VxD interface module 250. The VxD interface module 250 interfaces to the operating systems specific device driver. Thus, the VDD interface module 250 is responsible for initializing the VxD for the Windows3.1 device driver (WIN3.1DD) 242, a Window95 device driver (WIN95DD), a Windows NT device driver (WINNTDD) 246, and OS/2 device driver (OS/2DD) 248.

The front end 170 is also responsible for displaying inspection information, interacting with a user, loading and initializing the diagnostic library components, allowing selection and specification of diagnostic tests, launching and monitoring diagnostic tests, displaying test status, and displaying all errors and recommended actions to the user. In turn, the diagnostic components 190 are responsible for identifying all hardware devices, specifying valid tests for hardware devices, relaying all information needed by the front end 170 to display and allow selection of diagnostic tests, executing diagnostic tests and relaying the test status and errors to the front end module 170.

All of the inspection information in the diagnostic for Windows software is gathered upon the execution of the Diagnostics for Windows and stored in a data engine 176. The front end module 170 uses the inspect engine 176 to display information to the user during the execution of the diagnostics. The inspect engine thus resides in the data engine 176 and contains information needed by the front end module 170.

All of the diagnostic test information for Diagnostics for Windows is gathered upon the execution of diagnostics and stored in the test engine 174. The front end module 170 uses the test engine 174 to display hardware devices and associated diagnostic tests to the user during that execution of diagnostics. The test engine 174 contains information that the front end module 170 needs to display the hardware devices and associated diagnostics to the user.

The test dispatcher 172 is responsible for scanning the lists of tests to be run and calling the individual diagnostic library components 190 to dispatch the diagnostic tests. The test dispatcher 172 is responsible for controlling a number of active threads as well as monitoring and reporting the status of the diagnostics tests.

The error handler 186 is responsible for logging and reporting all errors when a diagnostic test fails. Thus, it is the responsibility of the components of the diagnostic library 190 to relay all error information to the error handler 186.

The error handler 186 contains information that the front end module 170 needs for reporting the error and determining a recommended action from the recommended action module 184. The recommended action module 184 holds several possible recommendation for each possible error. The handler 184 will interact with a small engine for field tests and use the network to access more complete information in factory tests.

During use, a number of phases of communication occur between the components of the front end module 170 and the diagnostic library 190, including loading, initialization, identification, test selection, test launching, test execution, initialization, configuration verification, and data collection. Turning now to the various phases of the DFW, the first phase is a loading phase. The loading phase occurs during the initialization of the Diagnostics for Windows software of the present invention, where the front end 170 searches and dynamically loads all of the applicable diagnostic library 190 components. During this loading phase, the front end module 170 dynamically loads the dynamic library components 192–219 and determines the address of the each entry point in the dynamic library via the Window application programming interface (API) Get_Proc_Address command. The dynamic loading of the DLs provides the ability to add and remove DLs at run time without recompiling and releasing the code.

The loading of the DLs is accomplished in a similar fashion to the loading of the test modules in MS-DOS based diagnostics. First, all known DLs are loaded in pre-defined sequence before third party DLs are loaded. The known DLs are loaded in sequence as defined by the DL load table. The table contains not only the names of the known DLs but also the functioning of the single entry point in the DL. After all the known DLs have been loaded, the front end module 170 searches the working directory for third party DLs or those DLs not listed in the DL load table. Once a third party DL has been found, it is loaded in the same fashion as a known DL via the Windows API load library command. The loading phase is complete when all DLs have been loaded at their entry points have been found. If an invalid address is returned when the Get_Proc_Address command is executed, the error is reported to the user.

The initialization on phase occurs after the DLs 192–219 have been loaded. During the initialization phase, the front end modules 170 issues an initialization command to each of the DLs 192–219 that have been loaded. During this phase, each DL performs whatever initialization it needs such as an allocation of resources to the ID modules 178 and 180. This phase creates instances of the DL class.

The identification (ID) phase occurs after the DLs have been initialized. During the ID phase, the front end module 170 issues an ID command to each of DLs 192–219 already loaded. The ID phase then identifies all devices that each DL is responsible for. The identification of the devices includes the identification of all devices such as device objects that the DL is responsible for, identifying all tests that are valid for each device found by the DL, determining the test parameters for each test, and relaying all information about the devices and tests to the test engine 174.

The test selection phase is then controlled by users as they select or deselect various test modes or specific tests. This phase occurs after the main screen of the Diagnostics For Window has been displayed. During this phase, the front end module 170 and the test engine 174 communicate with the various DLs by modifying the test parameters as changed by the user.

Next, the test launching phase is controlled by the user when the "Test Begin" button is actuated. During this phase, information needed to launch and monitor each test is copied from the test engine 174 to the test dispatcher 172. The test dispatcher is responsible for launching and monitoring the test execution. The test dispatcher 174 scans the list of test to run and launches each test by issuing a launch command to the DL 192–219 that the test belongs to. Once the DL 192–219 receives a launch test command, it must determine which of the tests it needs to run and for which device. Once a device and a test have been determined, the DL starts the thread for the test to run and immediately returns control to the test dispatcher.

During the test execution phase which occurs after a test has been launched, at least two threads are running, which are the thread that the front end module 170 is running in and the thread that the test is running in. The test thread where the actual testing of the device occurs is responsible for posting messages to the front end 170 thread about the progress of the test. The front end 170 thread is responsible for responding to posted messages and monitoring all of the test threads that are running. The test execution phase for the memory and video system is discussed in detail below.

Finally, during the uninitialization phase when the user exits the Diagnostics for Windows routine, the front end module 170 frees all resources used. Furthermore, during the uninitialization phase, the front end module 170 issues an uninitialization command to each of the DLs 192–219 that is loaded. It is the responsibility of the DL 192–219 to recognize this uninitialization command and free all resources that were allocated during the initialization.

Figure 3A:
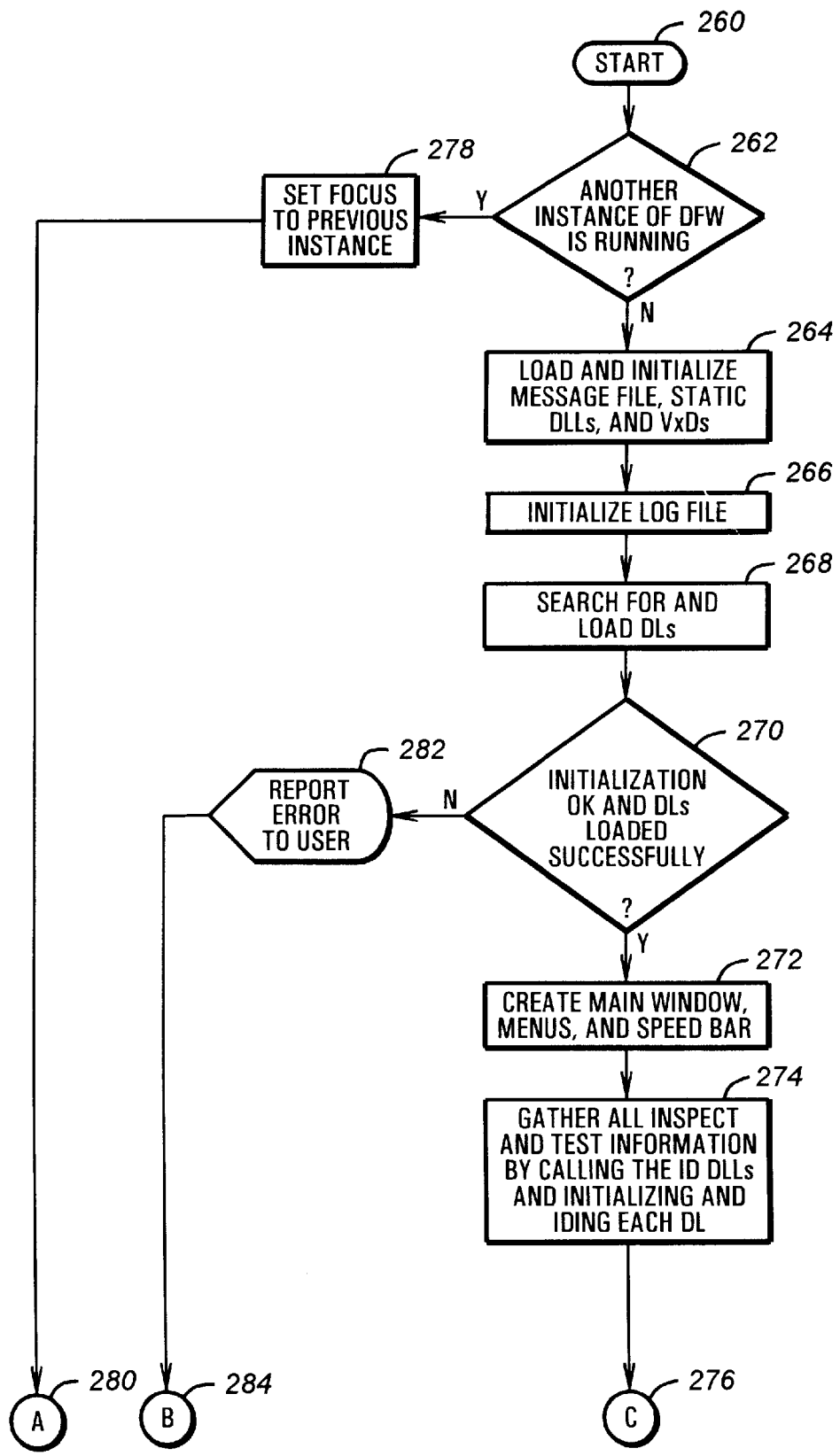
FIGS. 3A, 3B and 3C are flowcharts illustrating a front end for the Diagnostics for Windows software of FIG. 2.
Figure 3B:
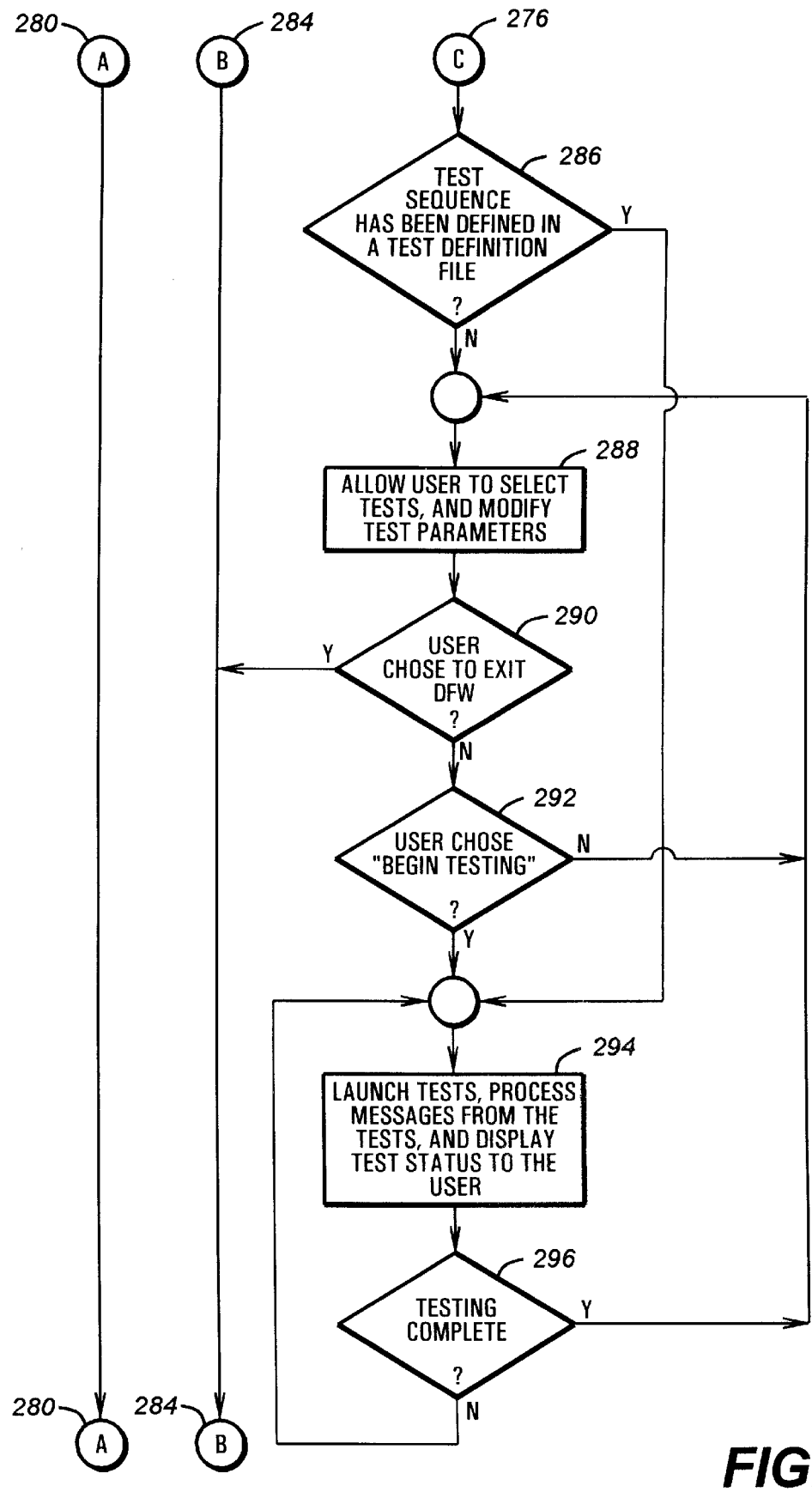
Figure 3C:
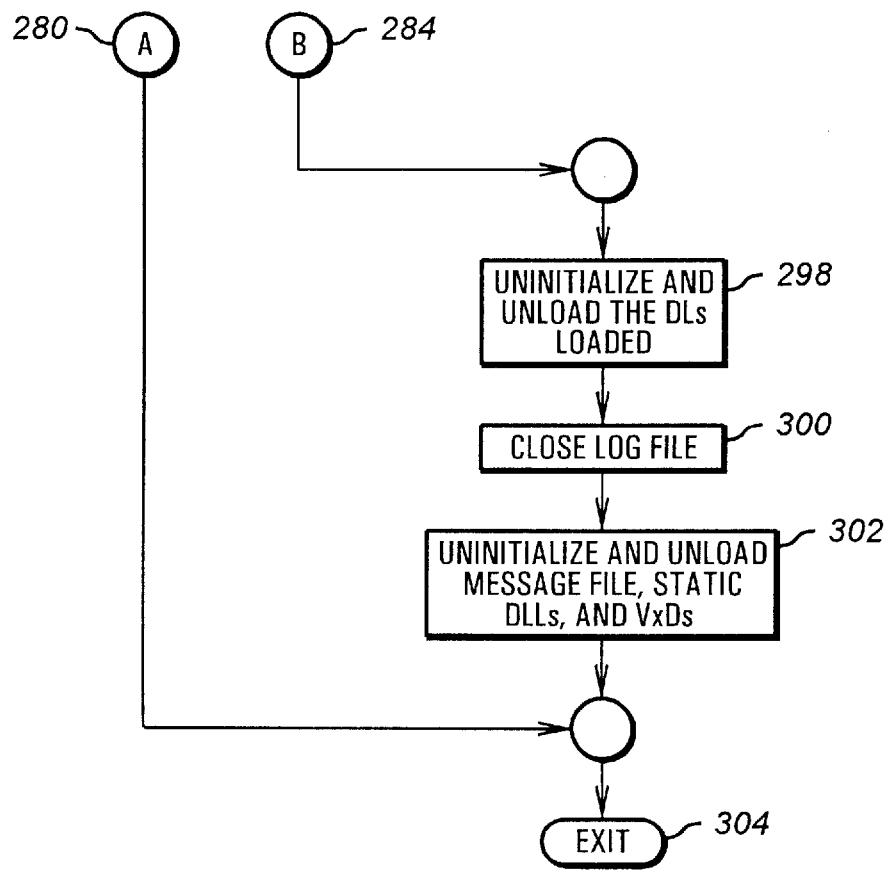

Turning now to FIGS. 3A, 3B and 3C, the front end module 170 is shown in more detail. In FIG. 3A, from a start step 260, the routine proceeds to step 262 where it checks whether another instance of the Diagnostics for Windows software is running. If not, the routine proceeds to step 264 where it loads and initializes various message files, static DLLs and VxDs in step 264. From step 264, the routine proceeds to step 266 where it initializes various log files before it searches for and loads the DLs in step 268. The routine checks in step 270 if the initialization process has been successful and if the DLs have been loaded. If so, the routine proceeds from step 270 to step 272 where it creates the main window and sets up the menus and the speed bars, which are bars to indicate the completion percentage of the tests being executed. From step 272, the routine proceeds to step 274 where it gathers all inspect and test information by calling the identification DLLs and initializes and identifies each DL. From step 274, the routine proceeds to step 286 of FIG. 3B via a connector C 276.

From step 262, in the event that another instance of the Diagnostics for Windows software is running, the routine proceeds to step 278 where it sets its focus to the previous instance of the Diagnostics for Windows software by setting the previously invoked software as the current active window rather than invoking a second copy of the software. Next, it proceeds to FIG. 3B via an A connector 280. Furthermore, from step 270, in the event that the initialization and the loading of the DLs are not successful, the routine proceeds from step 270 to step 282 where it reports various errors to the user. From step 282, the routine of FIG. 3A proceeds to FIG. 3B via a connector B 284.

Referring now to FIG. 3B, from the C connector 276, the routine proceeds to step 286 where it checks if the test sequence has been defined in a test definition file (TDF). If not, the routine proceeds to step 288 where it allows the user to select tests and further to modify test parameters if necessary. From step 288, the routine checks if the user has selected the exit option on the menu of the Diagnostics for Windows software in step 290. If so, the routine proceeds to FIG. 3C via the connector B 284. Alternatively, in the event that the user wishes to continue testing via the Diagnostics for Windows software in step 290, the routine checks in step 292 whether or not the user has selected the begin testing mode of the software. From step 292 or from step 286, in the event of the test sequence has been defined in the TDF, the routine proceeds to step 294 where it launches tests, processes messages from the tests and displays the test status to the user. From step 294, the routine checks to see if the testing has been completed in step 296. If not, the routine of FIG. 3B loops back to step 288 to allow the user to select and modify tests as necessary. Alternatively, in the event that the particular test has not been completed in step 296, the routine loops back to step 294 where the additional tests are launched as necessary.

Turning now to FIG. 3C, from the B connector 284, the routine proceeds to step 298 where it uninitializes and unloads the diagnostic library routines that were loaded in step 268. Next, it closes the log files in step 300 and uninitializes and unloads the message files, static DLLs and VxDs in step 302. Additionally, from the A connector 280 or from step 302, the routine of FIG. 3C exits in step 304.

Figure 4:
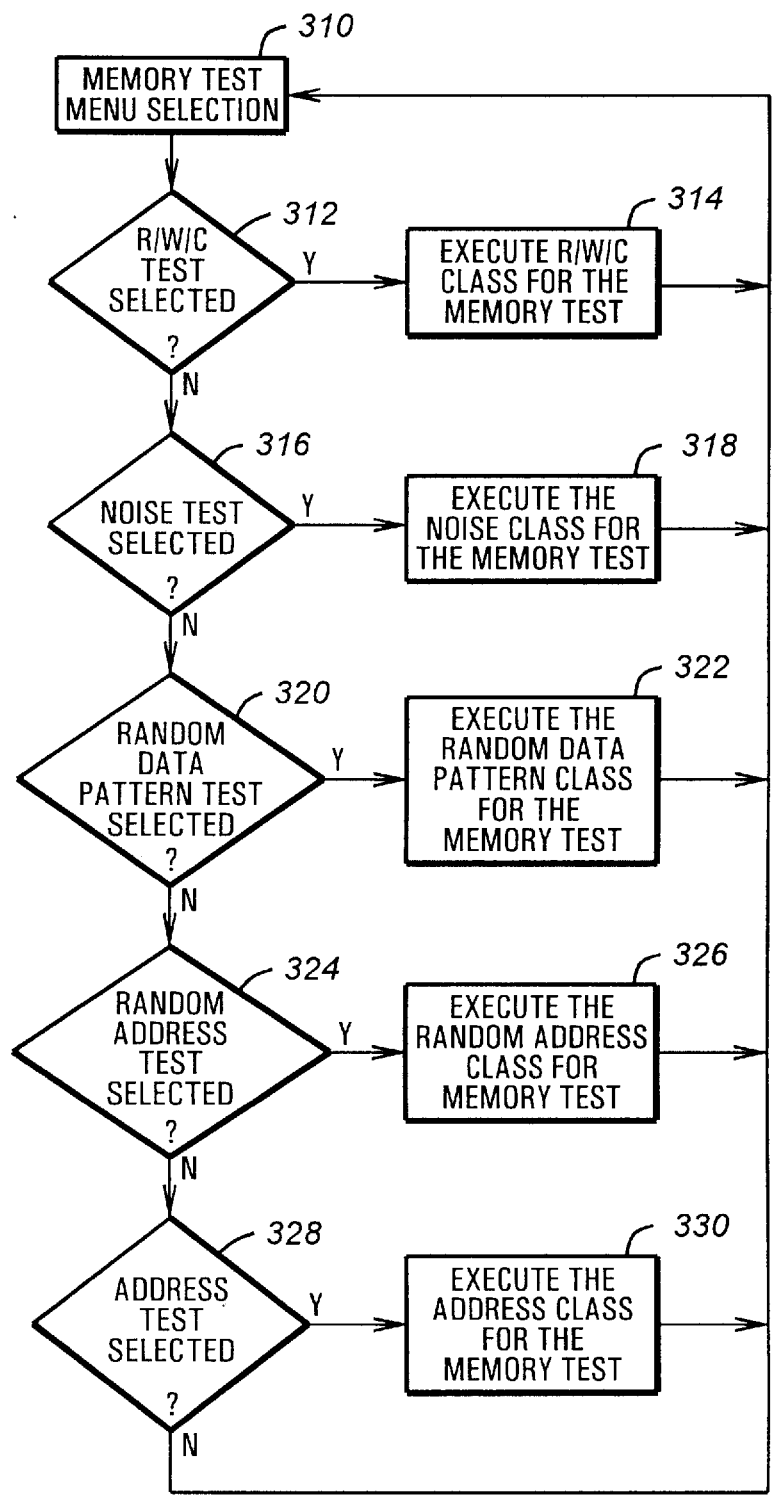
FIG. 4 is a flowchart illustrating in more detail a memory test diagnostic library module for the Diagnostics for Windows software of the present invention.

Turning now to FIG. 4, one of the routines launched in step 294 of FIG. 3B is a memory test routine. In the event that the user selects a memory test selection in the menu, the routine of FIG. 4 is executed. From step 310, the routine of FIG. 4 proceeds to step 312 where it checks if the read/write/check (R/W/C) test has been selected in 312. If so, the R/W/C test is executed to perform the memory test in step 314. Alternatively, from step 312, if the R/W/C test has not been selected, the routine proceeds to step 316 where it checks if a noise test has been selected. If so, the routine proceeds from step 316 to step 318 where it executes the noise class for the memory test of FIG. 4.

Alternatively, from step 316, in the event that the noise test has not been selected, the routine proceeds to step 320 where it checks if a random data pattern test has been selected. If so, the routine proceeds to step 322 where it executes the random data pattern memory test. In the event that the random data pattern test has not been selected in step 320, the routine proceeds to step 324 where it checks if the random address test has been selected. If so, the routine proceeds from step 324 to step 326 where it executes the random address class for the memory test. Alternatively, from step 324, in the event that the random address test has not been selected, the routine proceeds to step 328 where it checks if an address test has been selected. If so, the address class is executed for the memory test in step 330. From step 314, 318, 322, 326, 328 or 330, the routine loops back to step 310 to continue the memory test selection in the menu until an exit option has been selected.

In addition to the R/W/C test 314, the noise test 318, the random data pattern test 322, the random address test 326 and the address test 330, additional tests can also performed. These tests include a marching test where patterns are marched across the memory array. The march test is illustrated in more detail in a chapter in A. J. Van De Goor's book "Testing Semiconductor Memories." This test is similar to a true walk bit test and is able to detect address faults, subset faults, transition faults, coupling faults and late coupling faults. Another test that is performed by the Diagnostics for Windows software of the present invention includes a walk test which verifies memory integrity by running a walking zero and a walking one pattern across a given test range in blocks of given subsizes. Furthermore, a stress test can be used which exercises the Windows 95 virtual memory pages swapping mechanism through a series of allocation requests such that memory usage will far exceed the system's actual physical memory. Preferably the stress test is executed while the memory random data pattern test is being executed.

Figure 5A:
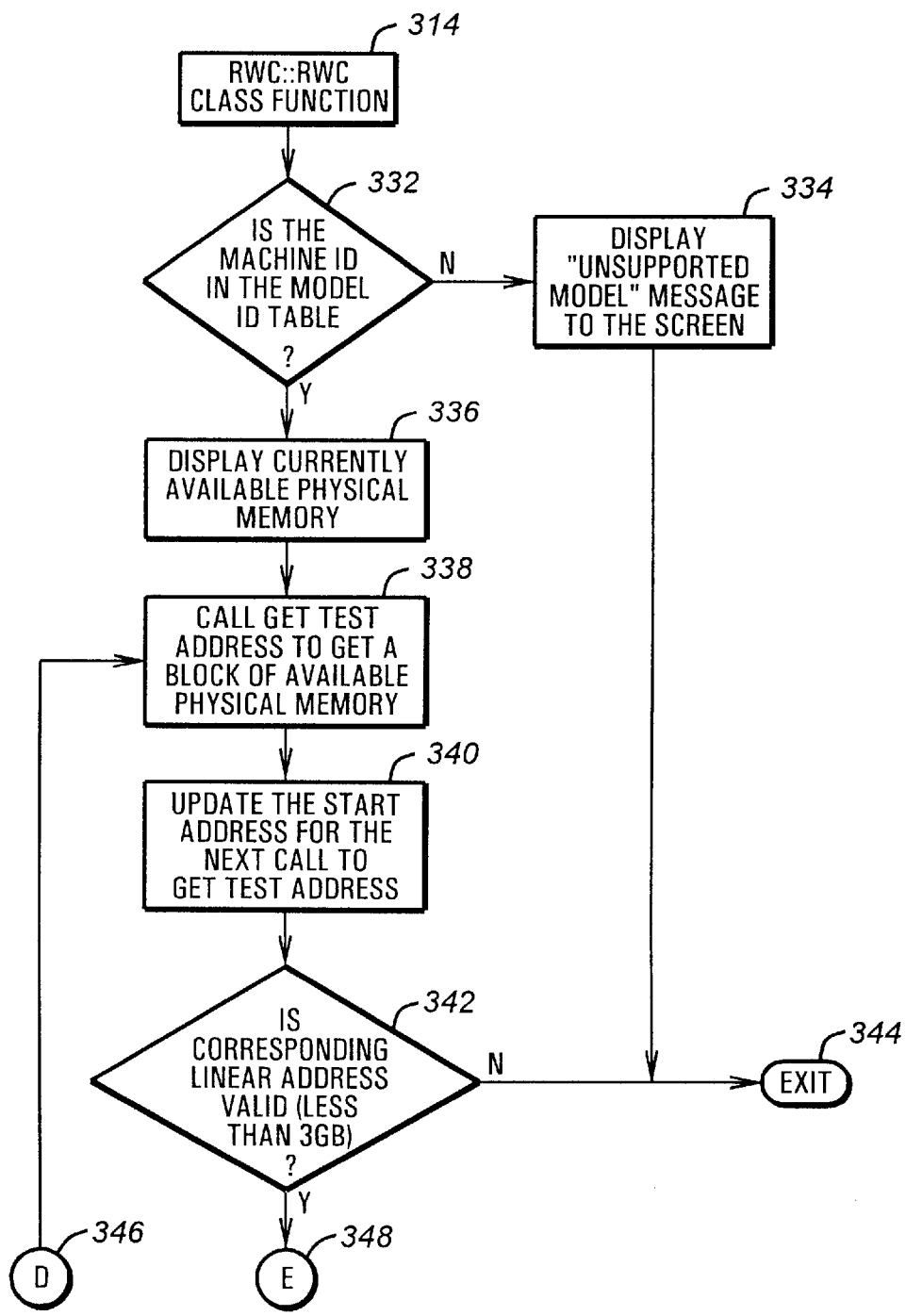
FIGS. 5A and 5B are flowcharts illustrating a R/W/C class for the memory test module of FIG. 4.
Figure 5B:
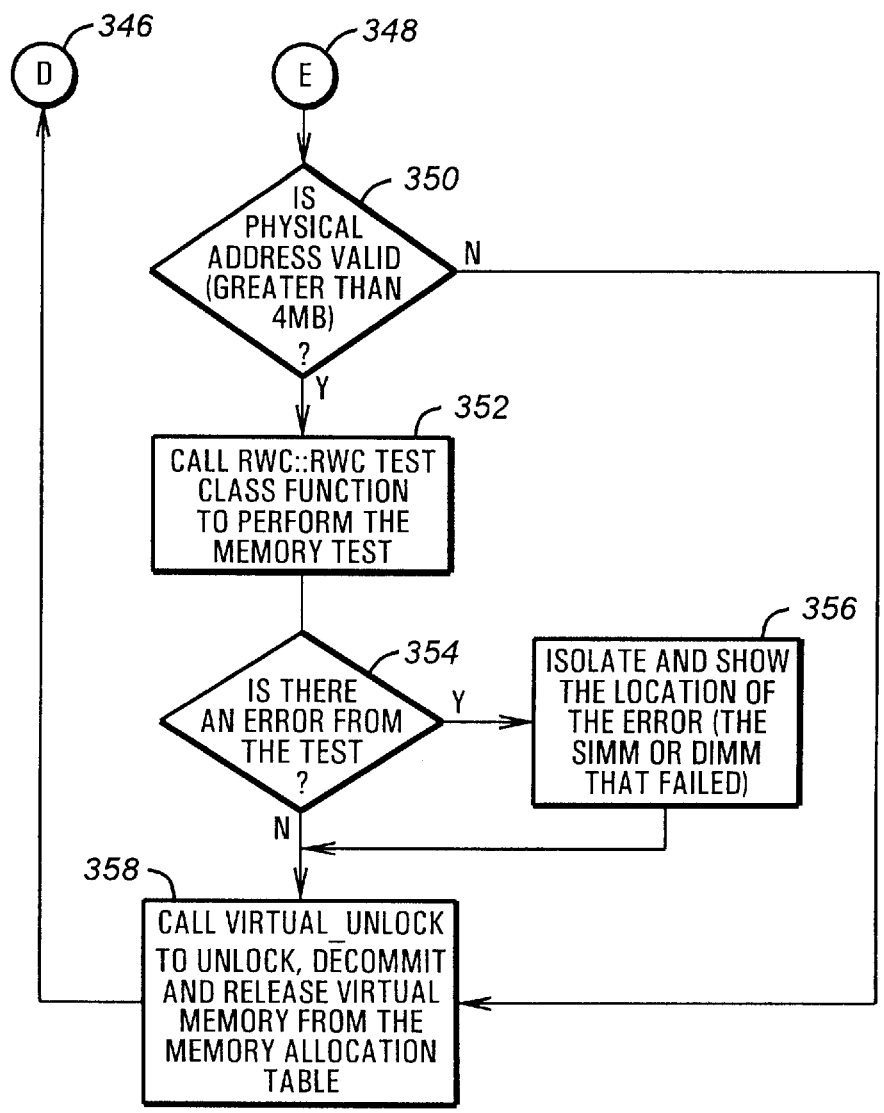

Turning now to FIGS. 5A and 5B, the routine for performing the R/W/C test of FIG. 4 is shown in more detail. From step 314, the routine of FIG. 5A proceeds to step 332 where it checks if the machine identification is in a model identification table. If not, the routine displays an "Unsupported Model" message to the screen in step 334 before it exits in step 344. Alternatively, in the event that the machine identification matches an entry in the model identification table, the routine proceeds from step 332 to step 336 where it displays currently available physical memory status to the user. Next, from step 336, the routine proceeds to step 338 where it calls a GetTestAddress routine to get a block of available physical memory. From step 338, the routine proceeds to step 340 where it updates a start address for the next call to GetTestAddress in step 340. From step 340, the routine checks the validity of the linear address where the virtual address is mapped into in step 342. The linear address is valid when it is greater than four megabytes and less than three gigabytes in address range. From step 342, in the event that the linear address is invalid, the routine proceeds to step 344 where it exits the R/W/C test class. Alternatively, in the event that the corresponding linear address is valid in step 342, the routine of FIG. 5A proceeds to FIG. 5B via an E connector 348. Turning now to FIG. 5B, from the E connector 348, the routine proceeds to step 350 where it checks the validity of the physical address. Preferably, the physical address is valid when it is greater than four megabytes in address range. This region should not be read/write tested for faults or errors like other memory in the system because the operating system resides therein. Any attempt at destructively testing the base memory of a computer system would then terminate operation of the computer system and hence the computer.

From step 350, in the event that the physical address is valid, the routine proceed to step 352 where it calls the R/W/C test class to perform the memory test. The R/W/C test classes shown in more detail in FIG. 6. From step 352, the routine checks if the test resulted in an error in step 354. If so, the routine proceeds from step 354 to step 356 where it isolates and shows the location of the error by pinpointing to the particular SIMM or DIMM that failed. From step 354 or 356, the routine proceeds to step 358 where it calls a virtual unlock routine Virtual_Unlock, as detailed in FIG. 11, to unlock and decommit and release the virtual memory from the memory allocation table. After step 358 have been completed, the routine proceeds back to step 338 of FIG. 5A via a D connector 346.

Figure 6:
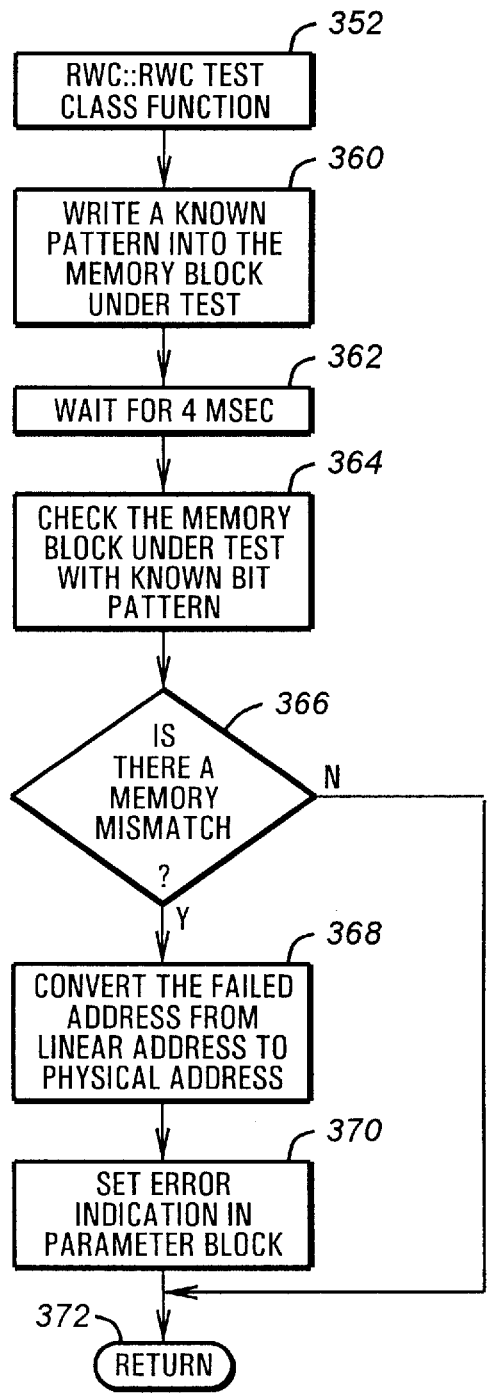
FIG. 6 is a flowchart illustrating in more detail a R/W/C test class of FIG. 5B.

Referring now to FIG. 6, the R/W/C test class function is shown in more detail. In FIG. 6, from step 352, the routine proceeds to step 360 where it writes a known pattern into the memory block under test. The memory test procedures known in the art and are discussed further in the publication discussed above entitled "Testing Semiconductor Memories," herein incorporated by reference. From step 364, the routine proceeds to step 366 where it checks if there is a memory mismatch. If so, the routine proceeds from step 366 to step 368 where it converts the failed address from the linear address to the physical address and proceeds to step 370 it sets an error indication for the particular parameter block. From step 370 or, step 366 in the event that there is no memory mismatch, the routine of FIG. 6 returns in step 372.

Figure 7A:
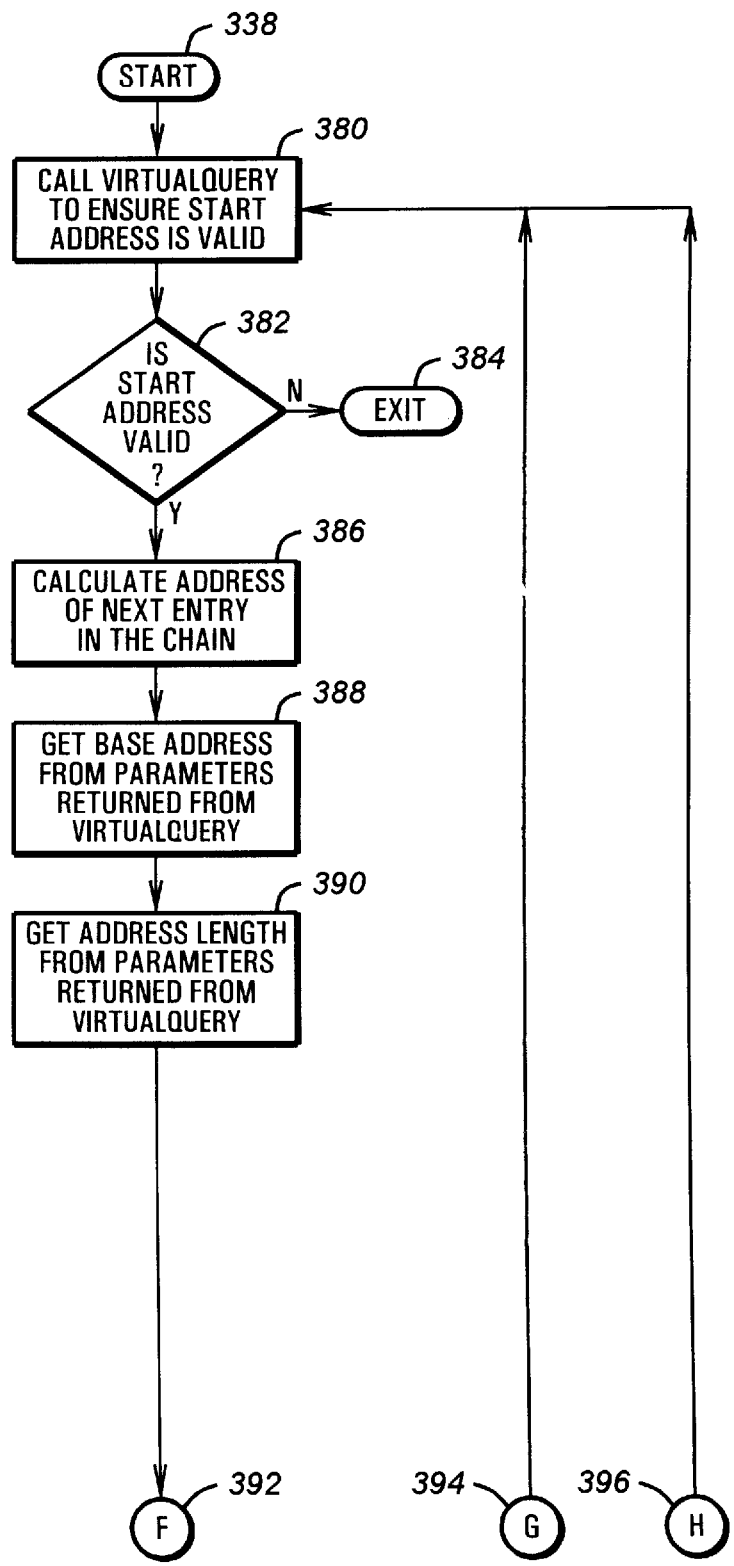
FIGS. 7A and 7B are flowcharts illustrating a process for obtaining memory for testing purposes of FIG. 5A.
Figure 7B:
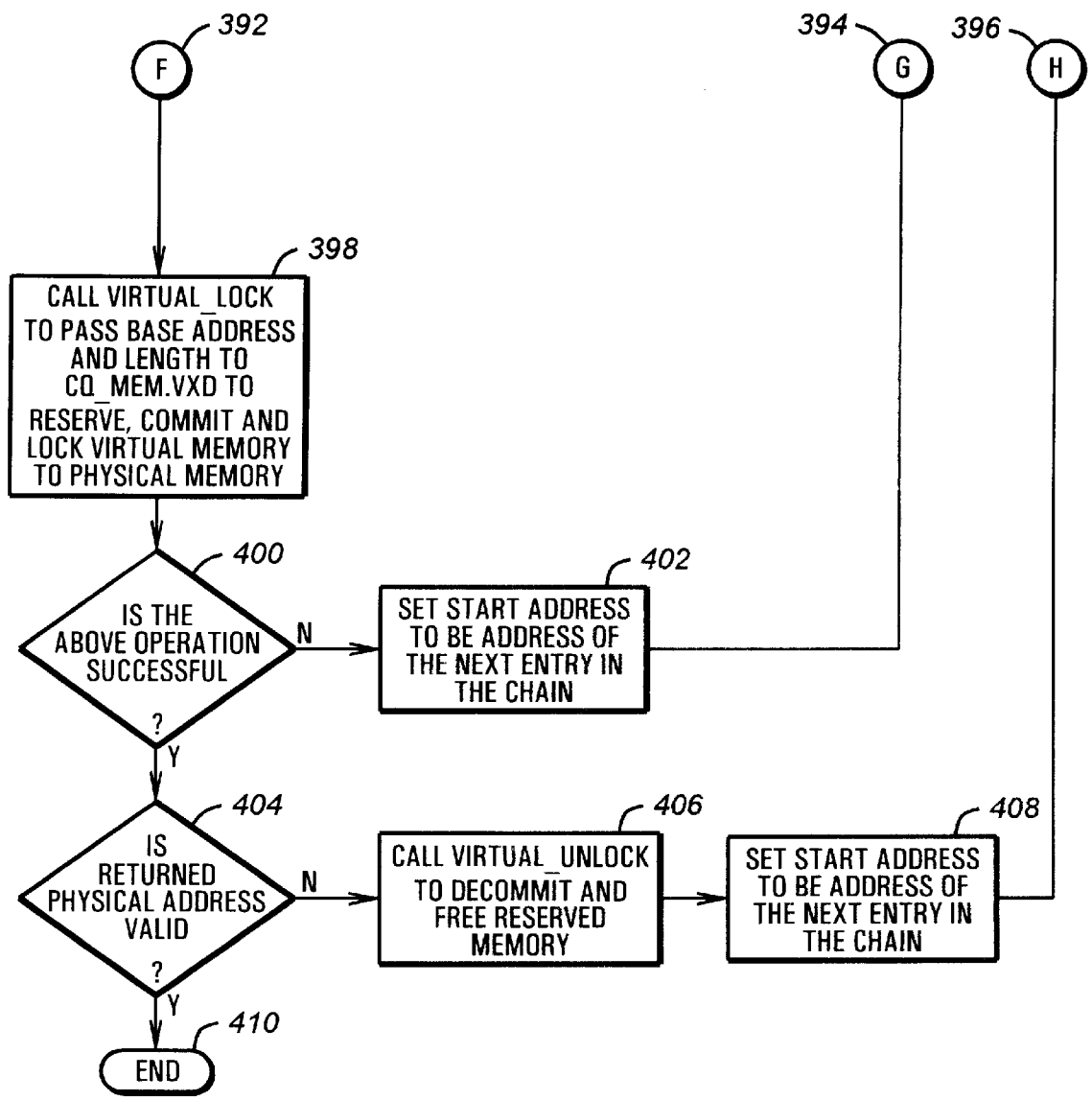

Referring now to FIGS. 7A and 7B, the routine to retrieve free memory for testing purposes is shown in more detail. From step 338 of FIG. 5A, the routine proceeds to step 380 where it calls a virtual query routine VirtualQuery to insure that the start address is within a valid range. Preferably, this address valid range is below four gigabytes. From step 380, the routine proceeds to step 382 where it checks if the start address is valid. As discussed earlier, a valid starting address range is greater than four megabytes in size in order to avoid overwriting into operating system location. In step 382, in the event the start address is invalid, the routine proceeds to step 384 where it exits. Alternatively, the routine proceeds from step 382 to step 386 where it calculates the address of the next entry in the virtual memory chain. Furthermore, from step 386, the routine proceeds to step 388 where it gets a base address from the parameters returned from the virtual query call of step 380. From step 388, the routine proceeds to step 390 where it gets an address length or size from parameters returned with the virtual query call of step 380. From step 390 the routine proceeds to FIG. 7B via an F connector 392.

Turning now to FIG. 7B, from the F connector 392, the routine proceeds to step 398 where it calls a virtual lock routine to pass a base address and length to the memory test VxD to reserve, commit and lock that virtual memory address to a physical memory location. Step 398 is discussed in more detail in FIGS. 8A and 8B. From step 398, the routine checks in step 400 if the virtual lock operation has been successfully completed. If not, the routine proceeds from step 400 to step 402 where it sets the start address to the address of the next entry in the virtual memory chain and returns to step 380 via a G connector 394. Alternatively, in the event that the virtual lock operation succeeded in step 400, the routine proceeds to step 404 where it checks if the return physical address is valid. If not, the routine calls a virtual unlock routine to decommit and free to reserve memory in step 406. Step 406 is illustrated in more detail in FIGS. 9A and 9B.

From step 406, the routine proceeds to step 408 where it sets the start address to be the address of the next entry in the virtual memory chain. From step 408, the routine returns to step 380 of FIG. 7A via an H connector 396. Alternatively, the event that the returned physical address is invalid in step 404, the routine of FIG. 7B exits via step 410.

The present invention thus supplements Windows-NT and Windows-95's application programming interface (API) calls that allow the user to specify the base addresses at which Windows is to reserve the memory space. In the present invention, after reserving the address space and committing the address space to physical memory, the memory buffer is attached to the desired physical memory space by adding a virtual memory locking mechanism. After the memory has been locked, the testing of the memory can be done in the Windows environment in the same way as is done in the DOS environment. Since the API call to lock virtual memory to physical memory is not provided in Windows95, and further since Windows95 does not allow the user to reserve or commit more than four megabytes of memory for testing through standard API calls, the invention provides modules which perform the process of reserving, committing and locking memory in the memory diagnostic library at the VxD level such that more than just four megabyte of a system memory can be tested at once, as discussed below.

Figure 8A:
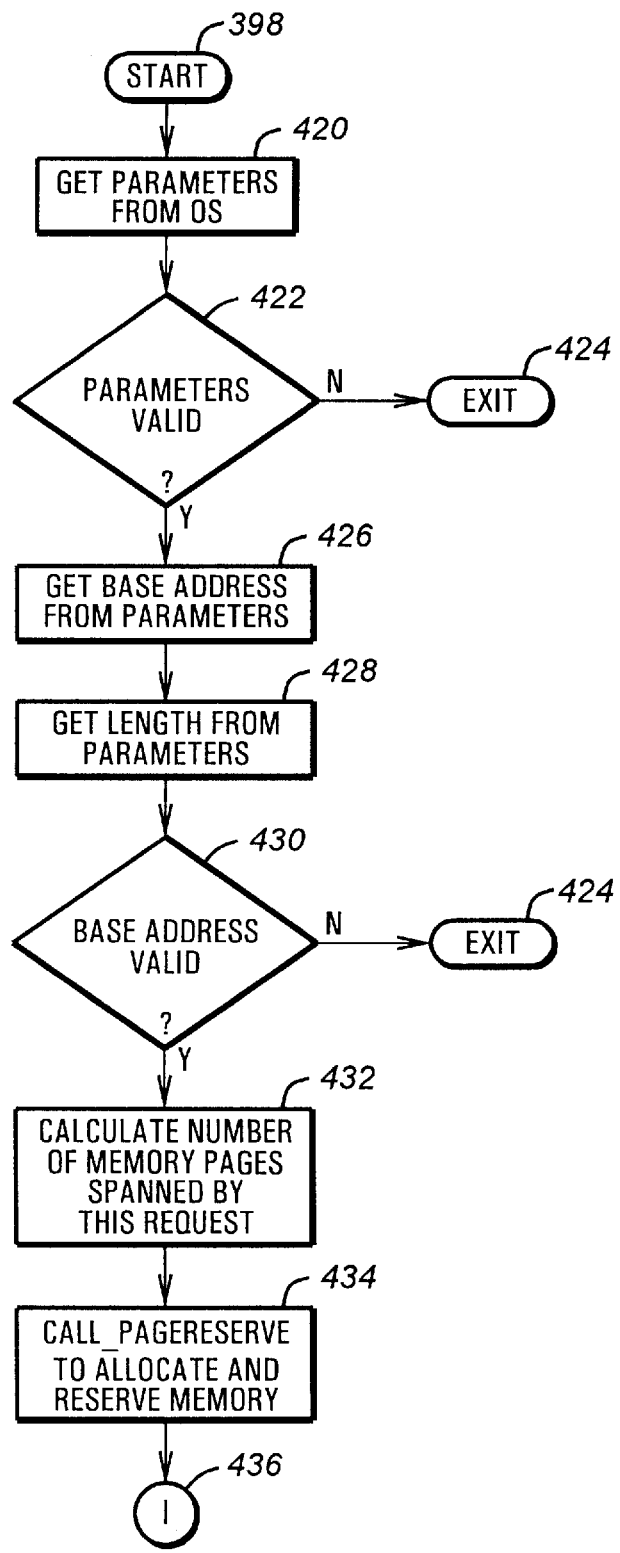
FIGS. 8A and 8B are flowcharts illustrating in more detail the process in FIG. 7B for reserving, committing and locking the memory to be tested.
Figure 8B:
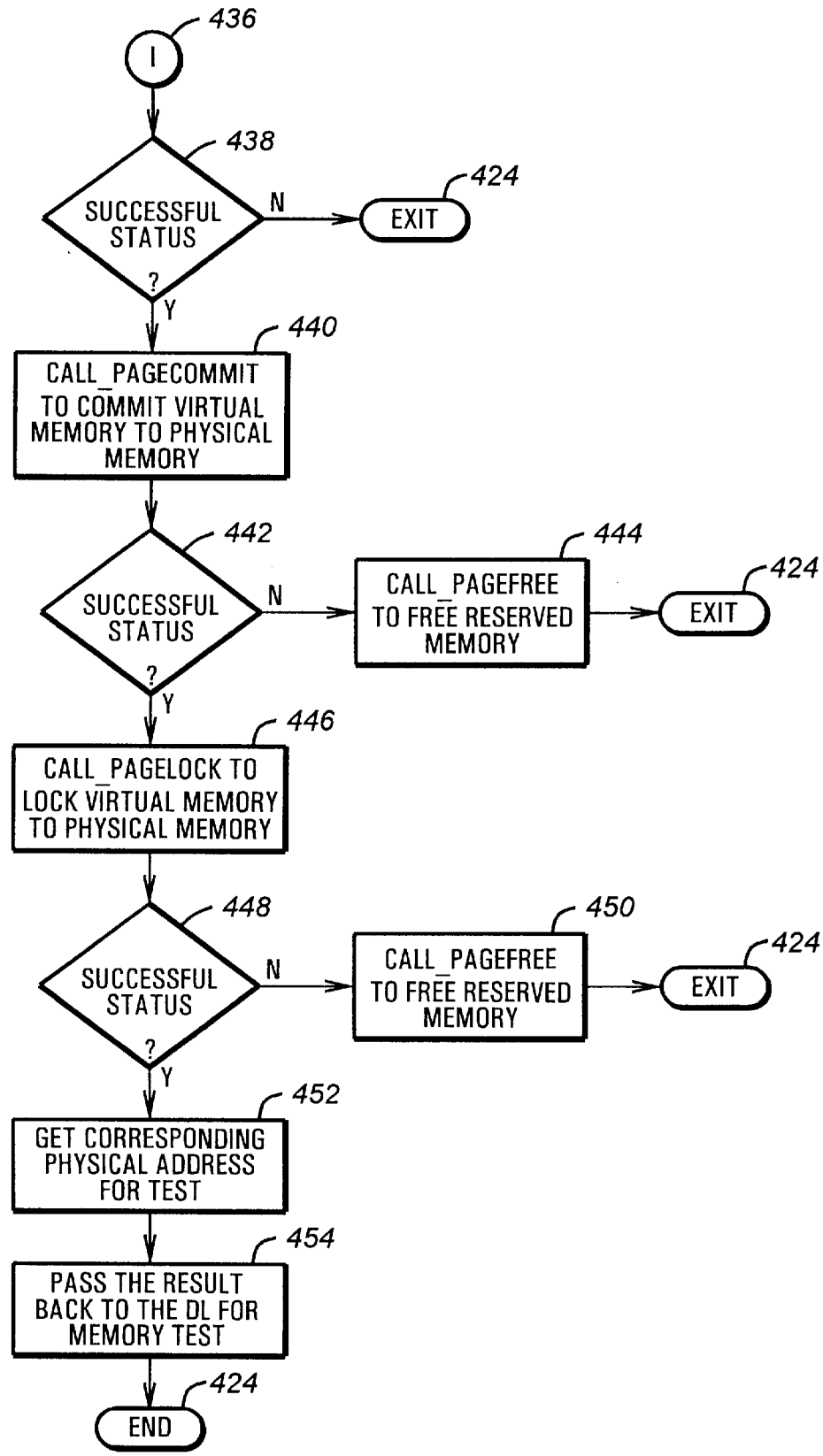

Referring now to FIGS. 8A and 8B, the routine to reserve, commit and lock memory for testing purposes is shown in more detail. From step 398 of FIG. 7B, the routine proceeds to step 420 where it obtains various parameters relating to the memory system from the operating system. Next, the routine proceeds from step 420 to step 422 where it checks if the parameters are valid. If not, the routine simply exits in step 424. Alternatively, in the event that the parameters are valid in step 422, the routine proceeds to step 426 where it gets these addresses from parameters supplied in step 420. Next the routine proceeds from step 426 to step 428 where it gets a length from the parameters. The length is indicative of the memory size of the block.

From step 428, the routine proceeds to step 430 where it checks if the base address is valid in the manner discussed earlier. In the event that the base address is invalid in step 430, the routine exits in step 424. Otherwise, the routine proceeds from step 430 to step 432 where it calculates the number of memory pages spanned by the requested memory block. From step 432, the routine calls a page reserve routine, which is a Windows95 or WindowsNT system call, to allocate and reserve the amount of memory in step 434. From step 434, the routine of FIG. 8A proceeds to FIG. 8B via an I connector 436.

Turning now to FIG. 8B, from the I connector 436, the routine proceeds to step 438 where it checks if the test reserve, commit and lock operation is successful. From step 438, in the event of a failure, the routine exits in step 424. Alternatively, from step 438, the routine proceeds with a call to a page commit routine to commit the virtual memory to the physical memory in step 440. Next, the routine proceeds from step 440 to step 442 where it checks for a successful status. In the event of a failure in step 442, the routine calls a page free routine which is an operating system call to free the reserve memory in step 444 before the routine exits in step 424.

Alternatively, from step 442, the routine calls a page lock routine of the WindowsNT or Windows95 operating system to lock the virtual memory to a physical memory in step 446. Next, the routine proceeds to step 448 where it checks for the status of the page lock call. In the event of a failure, the routine proceeds to step 450 where it calls page free routine to free the reserve memory, as discussed earlier. From step 450, the routine proceeds to step 424 where it exits.

In the event that the page lock routine is successful, the routine proceeds from step 448 to step 452 where it gets a corresponding physical address for the test and furthermore passes the result back to the diagnostic library routine for the performing the memory test in step 454. From step 454, the routine exits in step 424.

Figure 9A:
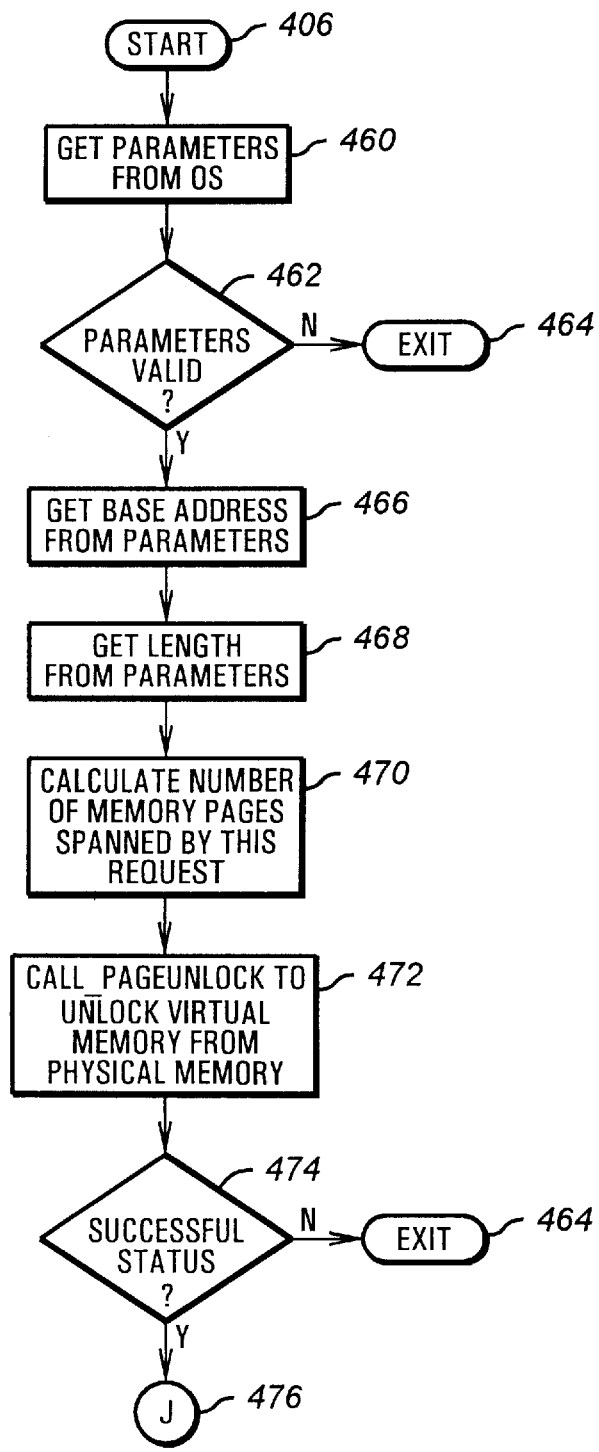
FIGS. 9A and 9B are flowcharts illustrating in more detail the process in FIG. 7B for unlocking and decomitting the memory to be tested.
Figure 9B:
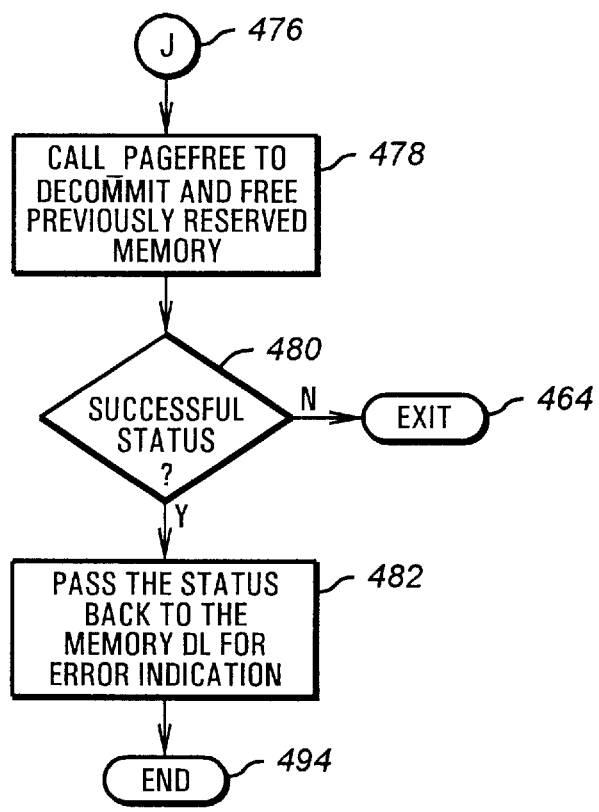

Turning now to FIGS. 9A and 9B, the corresponding routine to unlock and decommit the virtual memory from the physical memory is shown in more detail. From step 406 of FIG. 7B, the routine proceeds to step 460 where it obtains various memory parameters from the operating system. It then checks for the validity of the parameters in step 462. In the event of invalid parameters, the routine proceeds from step 462 to step 464 where it exits. Alternatively, in the event that the parameters are valid, the routine proceeds from step 462 to step 466 where it obtains a base address from the parameter list. Furthermore, it obtains the length or the size of the memory block from the parameters provided in step 468. From step 468, the routine computes the number of memory pages spanned by the request in step 470. Preferably, the memory page size computation is performed in 4K increments.

From step 470, the routine calls page unlock routine which is an operating system called to unlock the virtual memory from the physical memory in step 472. Next, the routine proceeds from step 472 to step 474 where it checks for the success of the page unlock operation. In the event of a failure, the routine proceeds from step 474 to step 464 to exit. Alternatively, in the event of a successful operation, the routine proceeds from step 474 to step 478 of FIG. 9B via a J connector 476.

Referring now to FIG. 9B, upon entering step 478 from the J connector 476 of FIG. 9A, the routine calls a page free operating system called to decommit and free the previously reserved memory block. Next it proceeds to step 480 where it checks for the success of the page free operation. In the event of a failure, the routine proceeds from step 480 to step 464 where it exits. Alternatively, in the event that the page free operation was successful, the routine passes the success status back to the memory diagnostic library routine for appropriate error indications if necessary in step 482. From step 482, the routine of FIG. 9B simply exits in step 494.

Turning now to FIG. 10, the routine that sends the request to perform the virtual lock operation as discussed in FIGS. 8A, 8B, 9A and 9B is shown in more detail. In FIG. 10, from the start step 484, the routine proceeds to populate the parameters with a base address, a length, a pointer to a new physical address, and to call a virtual memory lock request in step 486. Next, in step 487, it calls a device input/output control (device I/O control) routine to send the request to the memory VxD 216 to perform the memory test operation. From step 487, the routine proceeds to step 488 to exit the virtual lock routine.

Turning now to FIG. 11, the routine that sends the request to unlock the virtual memory operation reserved in FIG. 10 is shown in more detail. In FIG. 11, from the start step 490, the routine proceeds to populate the parameters with a base address, a length, and a virtual memory unlock request (VMM_unlock) request in step 492. From step 492, the routine calls the device I/O control routine, as discussed earlier to send the request to the memory VxD 216 in step 494. From step 494, the routine of FIG. 11 exits in step 496.

In the above discussed manner, the present invention allows the user to specify the base address at which Windows is to reserve the memory space. Furthermore, it implements a memory diagnostic library at the VxD level to allow more than four megabytes of the system memory to be tested at a time. Additionally, the present invention provides a mechanism for reserving, committing and locking memory to a physical memory for testing purposes. The locking of the memory is accomplished by (1) starting at the first entry of the virtual memory chain and getting the memory base address and the length of the current entry in the chain; (2) sending a request to the memory of the VxD test to reserve, commit and lock the memory block into physical memory; (3) testing the current memory block using the current base address and length; and (4) traversing the next entry in the chain and repeats up to until the last virtual memory chain has been processed. Thus, the present invention provides a cost effective and rapid system for testing main memory.

Figure 12A:
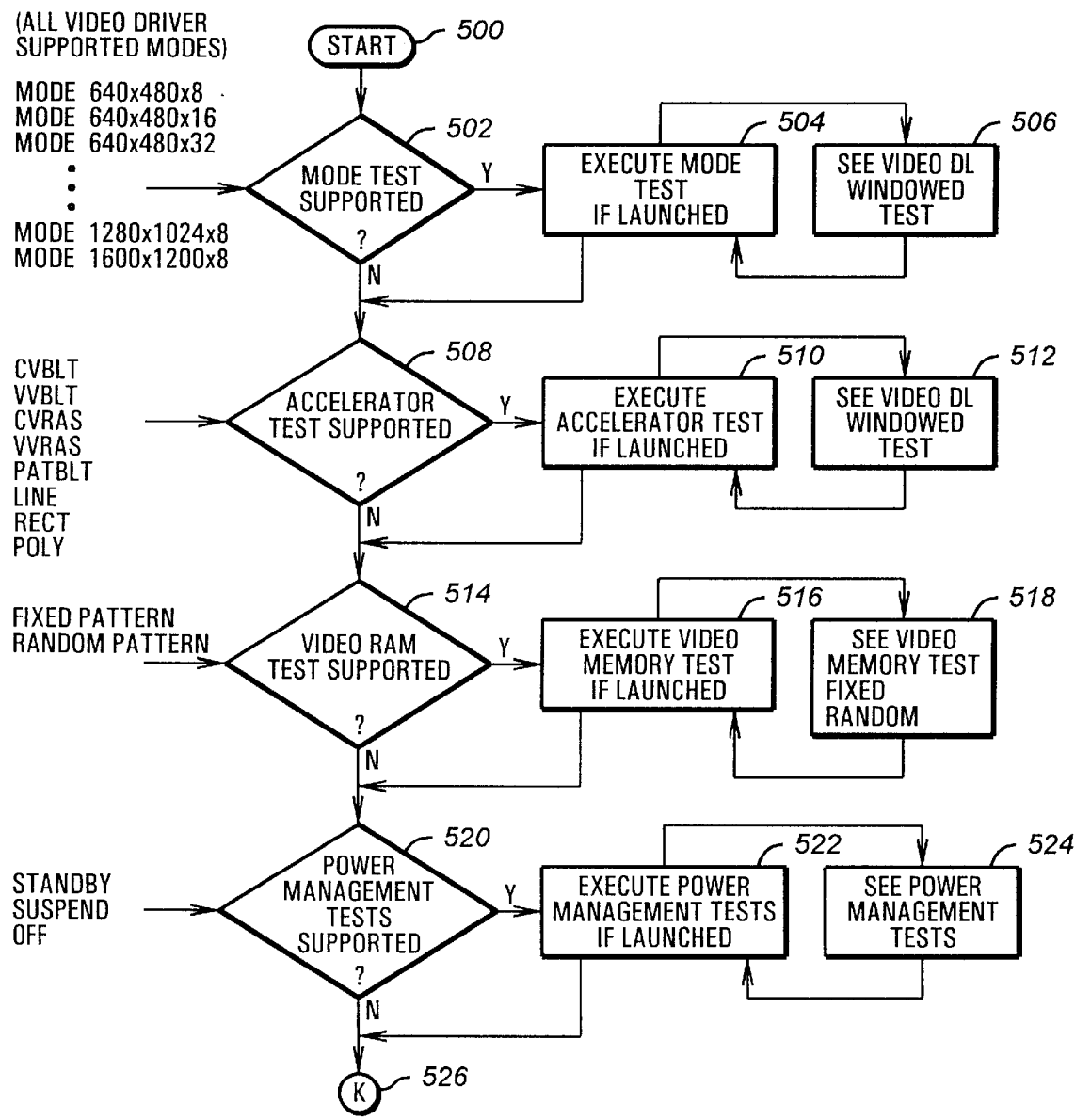
FIGS. 12A and 12B are flowcharts illustrating in more detail a video test diagnostic library module for the Diagnostics for Windows software of the present invention.
Figure 12B:
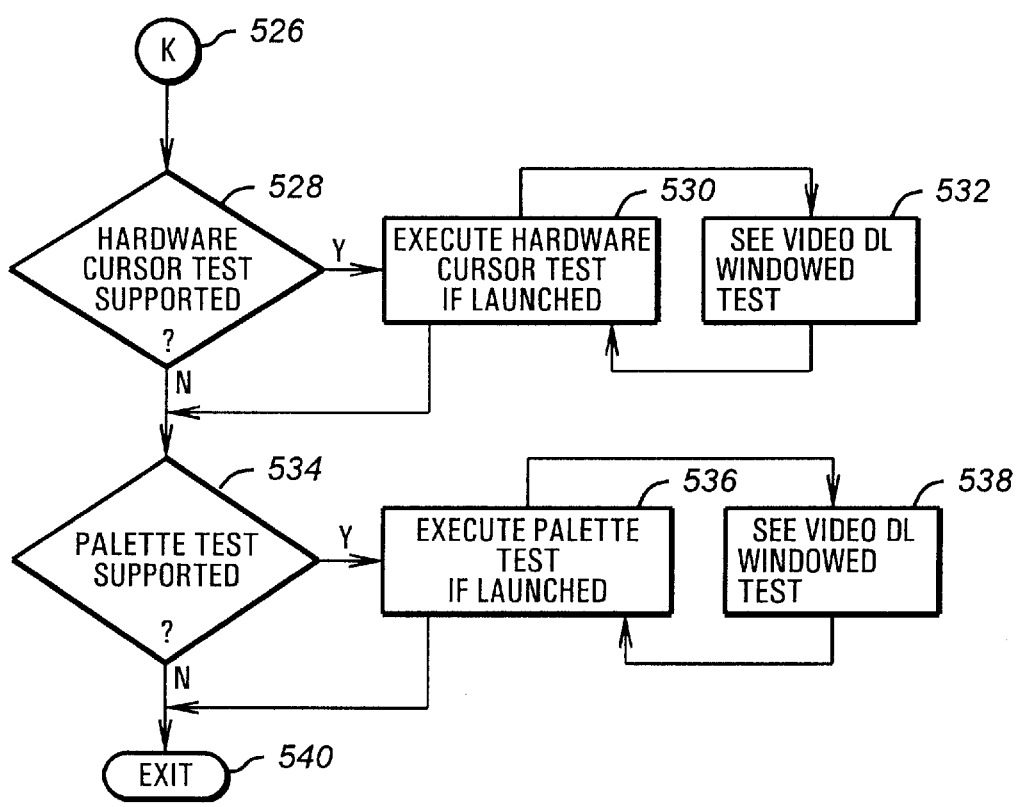

Turning now to the software routines to test the video, FIGS. 12A and 12B illustrate the video diagnostic library 212 in more detail. Starting from step 500, the routine of FIG. 12A proceeds to step 502 where it checks on the mode supported by the graphics adapter 140. The modes supported in step 502 include a 640×480×8, 640×480×16, 640×480×32, . . . , 1280×1024×8, and 1600×1200×8. In step 502, in the event that the particular graphics adapter mode is supported by the test routine, the routine proceeds to step 504 to execute the mode test. From step 504, the routine proceeds to step 506 where it proceeds with a video DL windowed test template 506. The video DL windowed test template 506 is illustrated in more detail below in FIGS. 13A and 13B. Next, the routine of FIG. 12A proceeds to step 508, which can also be reached in the event that the mode test is not supported in step 502.

In step 508, the routine checks if an accelerator test is supported. These tests include CVBLT, VVBLT, CVRAS, VVRAS, PATBLT, LINE, RECT, and POLY. In the event that the accelerator test is supported in step 508, the routine proceeds to step 510 where it executes the accelerator test if the test has been launched. Step 510 subsequently proceeds to step 512 where a video DL windowed test template is displayed. Upon completing the video DL windowed test template of step 512, the routine proceeds to step 514. Alternatively, from step 508, in the event that the accelerator test is not supported, the routine also proceeds to step 514 where it checks if the video RAM test is supported.

In step 514, the routine checks if the video RAM test is supported for a fixed pattern or a random pattern. In the event that either fixed or random pattern video RAM tests are supported, the routine proceeds to step 516 where it executes a video memory test in the event the test has been launched. From step 516, the routine proceeds to step 518 where it performs the video memory test for the fixed pattern or the random pattern as requested. Step 518 is illustrated in more detail in FIGS. 15A, 15B and 16. Upon completion of step 518, the routine goes to step 520 to check on the power management tests. Alternatively, in the event that the video RAM test is not supported in step 514, the routine of FIG. 12A also proceeds to step 520.

In step 520, the routine checks if a power management test is supported by the DFW software. These tests include a standby mode, a suspend mode and an off mode test. In the event that the power management test is supported in step 520, the routine proceeds to step 522 where it executes a power management test if it has been launched. Upon launching, the routine proceeds from step 522 to step 524 where it performs the power management test, as detailed in FIG. 18. Upon completing the power management test in step 524, the routine of FIG. 12A proceeds to step 528 of FIG. 12B via a K connector 526.

Turning now to FIG. 12B, upon entering step 528 via the K connector 526, the routine of FIG. 12B checks if a hardware cursor test is supported in the DFW software. In the event that a hardware cursor test is supported, the routine proceeds from step 528 to step 530 where it executes the hardware cursor test if the test has been launched. From step 530, the routine then executes a video DL windowed test template 532, as discussed above. At the end of the video DL windowed test template 532, the routine proceeds to step 534 where it checks if a palette test is supported in the present version. If so, the routine proceeds to step 536 where it executes a palette test if the test has been launched. A logical color palette is a buffer between color intensive applications in the system, allowing these applications to use as many colors as needed without interfering with colors displayed by other windows. This test uses a create palette function to create a logical color palette for the system. Once an application creates a logical palette, it can select a palette into a device context by calling a select palette function. A palette selected into a device context can be realized by calling a realized palette function. When the palette is no longer needed, a call to delete the palette object can be used to remove the object. The realize palette function maps palette entries from the current logical palette into the system palette.

From step 536, the routine proceeds to step 538 where it executes a video DL windowed test template 538. Upon completion of the video DL windowed test template 538, the routine proceeds to step 540. If the palette test is not supported, the routine also proceeds with step 540. Thus, the video diagnostics library of FIGS. 12A and 12B completes its operation and exits via step 540.

Figure 13A:
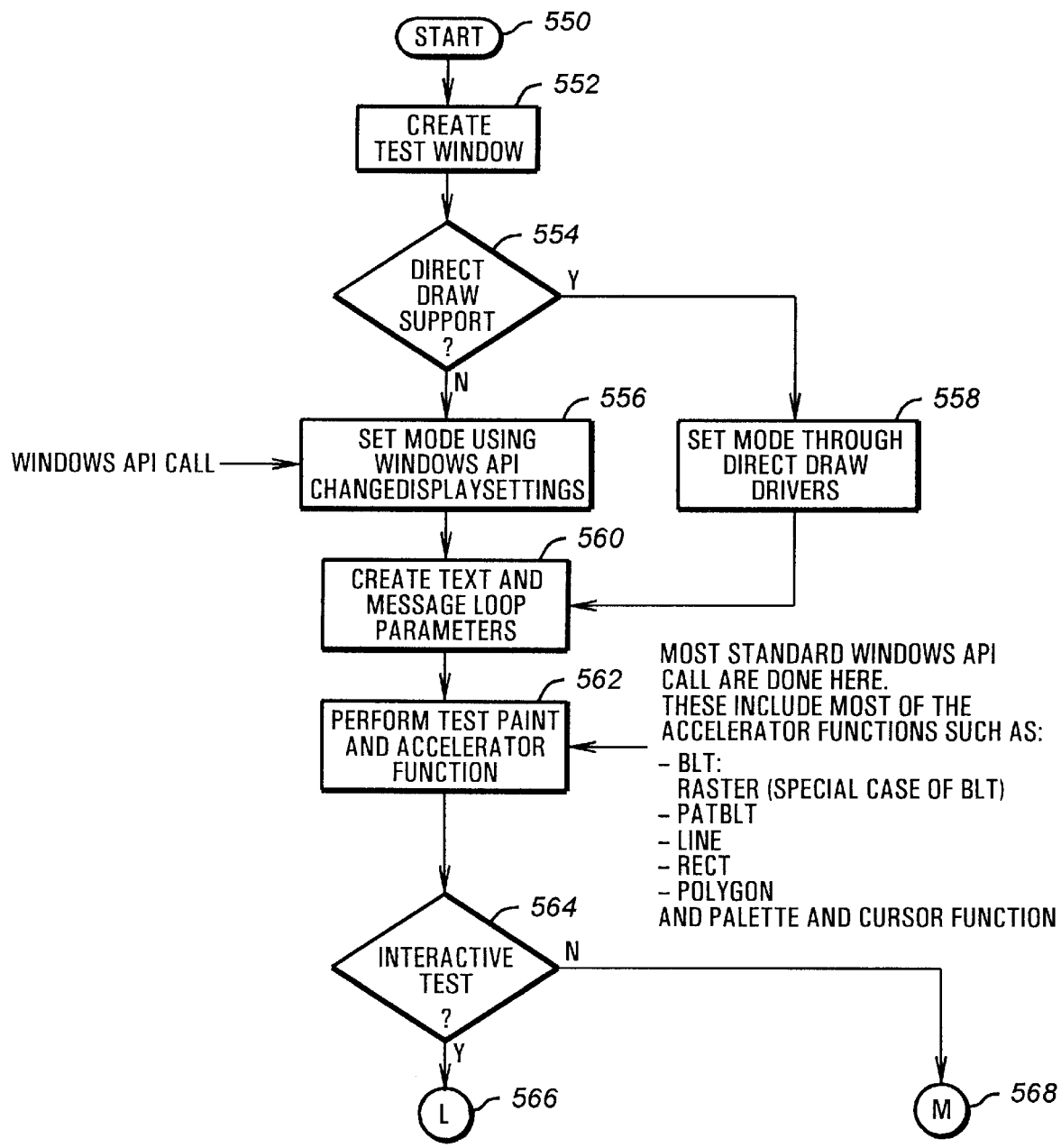
FIGS. 13A and 13B are flowcharts illustrating in more detail the process for performing mode tests and accelerator tests for the video test module of FIGS. 12A and 12B.
Figure 13B:
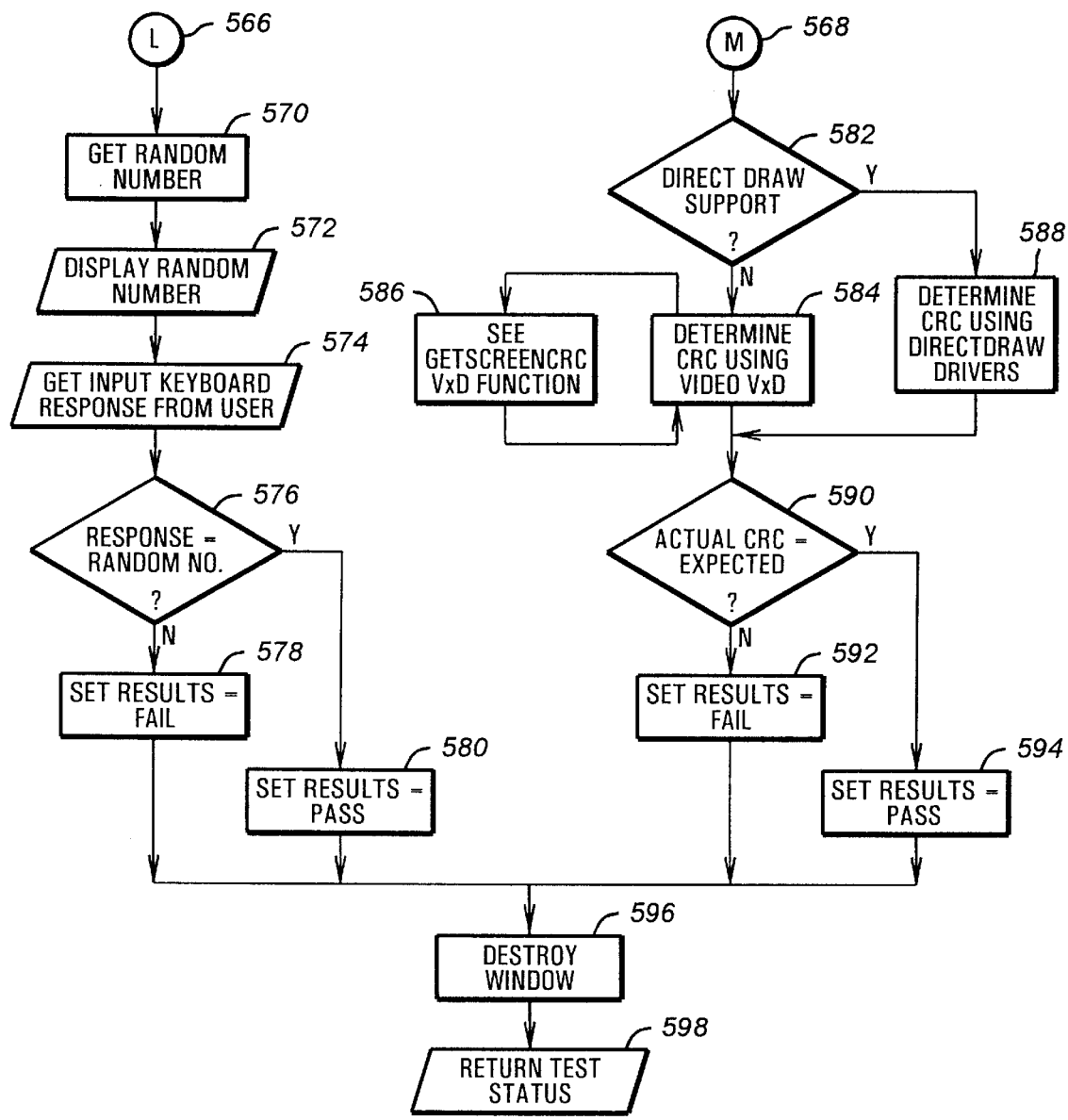

Turning now to FIGS. 13A and 13B, the routine to perform the video DL windowed test template for all windowed tests is illustrated in more detail. In step 550, upon entering the video DL windowed test, the routine creates a test window in step 552. From step 552, the routine proceeds to step 554 where it checks whether Direct Draw, a software routine available from Microsoft Corp. of Redmond, Wash., is supported by the library routine of the diagnostic library. In the event that Direct Draw routines are not supported, the routine of FIG. 13A proceeds to step 556 where it sets the display mode using a Windows API to change the display setting using a Windows API call. The change display settings function changes the display settings into the specified graphics mode. The parameters to be provided to change display settings include a bits per pixel parameter, a pixel width parameter, a pixel height parameter, a mode flag parameter and a mode frequency parameter.

From step 556, the routine of FIG. 13A proceeds to step 560 where it creates the text and message loop parameters. Alternatively, in the event that Direct Draw routines are supported in step 554, the routine of FIG. 13A proceeds to step 558 where it sets the appropriate mode through calls to the respective Direct Draw device drivers. From step 558, the routine of FIG. 13A proceeds to step 560 to create the text and the message loop parameters. Next, the routine of FIG. 13A proceeds to step 562 where it performs various test paint and accelerator functions. Step 562 includes tests on most of the accelerator functions such as BITBLT, PATBLT, line, rectangle, and polygon. The BITBLT function performs a bit block transfer of the color data corresponding to a rectangle of pixels from a specified source device context into a destination device context. The PATBLT function paints the given rectangle using a brush that is currently selected in the specified device context. The brush color and the surface colors are combined using the given raster operation. The line function and the rectangle function draws a line and a rectangle, respectively. The rectangle is outlined using the current pen and field using the current brush. Further, the fill rectangle function fills a rectangle by using the specified brush. The polygon function draws a polygon consisting of two or more vertices connected by straight lines. The polygon is outlined using the current pen and fill using the current brush and polygon fill mode. In each mode test, the mode is set and rectangles are drawn in accordance with the set mode. Additionally, step 562 includes test on palette and cursor functions. From step 562, the routine of FIG. 13A checks if an interactive test is to be performed. In the event that the interactive test mode has been selected, the routine of FIG. 13A proceeds to step 570 via an L connector 566. Alternatively, in the event that the user has not selected the interactive text, the routine of FIG. 13A proceeds to step 582 via an M connector 568.

Turning now to FIG. 13B, from the L connector 566, in the event that an interactive test has been selected, the routine of FIG. 13B generates a random number in step 570. This number is eventually displayed on the display system before the system prompts the operator to enter the number displayed. Although the subjective process or checking the quality of the display display systems is relatively simple, the manual verification of the quality of numerous display systems can be monotonous. Thus, the human operators who assemble and test the display component, principally the video graphics controller or adapter 140 of the computer S can be lulled into a mode where they simply pass every display system assigned to them. By requesting the operator to enter the number observed on the screen, the routine of FIGS. 13A and 13B ensures that the operator is actually observing a successful test before he or she makes a judgment as to whether the display system passed or failed quality assurance.

In step 572, the routine displays a random number and proceeds to request that the user input the number via the keyboard in step 574. From step 574, the routine proceeds to step 576 where it checks if the user's response matches the random number. If not, the routine proceeds to step 578 to set a failure flag. Alternatively, in the event a response matches the random number generated, the routine proceeds from step 576 to step 580 to set a passing flag. The setting of the failure flag eventually causes the display system to be rejected, whereas the setting of the passing flag allows the display system to be shipped to the customer. Thus, steps 566–580 ensure that factory personnel do not miss problems associated with various display characteristics of the video system.

In the event that the interactive mode is not selected in step 564 of FIG. 13A, the routine of FIG. 13A proceeds to step 582 via the M connector 568. From step 582, in the event that Direct Draw routines are not supported, the routine proceeds to step 584 where it determines a cyclic redundancy code (CRC) using a video VxD. Once the CRC has been computed in step 584, the routine proceeds to step 586 where it executes a get screen CRC using a video VxD. Alternatively, in the event that Direct Draw routines are supported in step 582, the routine proceeds to step 588 where it determines the CRC using Direct Draw device drivers. From either step 584 or step 588, the routine then checks in step 590 whether the actual CRC is equal to the expected CRC. If not, the proceeds from step 590 to step 592 where it sets a video RAM failure flag. Alternatively, in the event that the actual CRC matches the expected CRC, the routine proceeds from step 590 to step 594 where it indicates success in testing the video RAM. From steps 578, 580, 592, or 594, the routine of FIG. 13B proceeds to step 596 where the window being tested is destroyed before the routine of FIG. 13B returns via step 598.

Figure 14A:
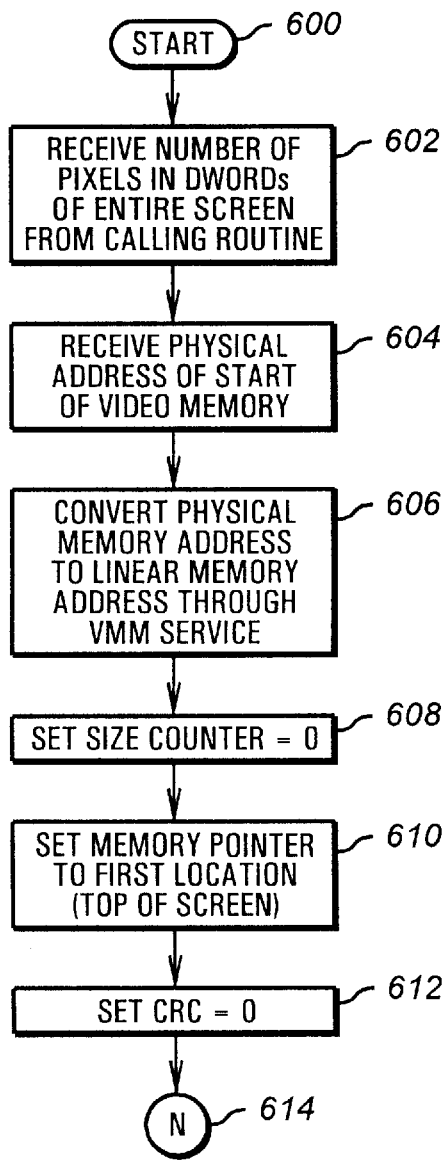
FIGS. 14A and 14B are flowcharts illustrating in more detail a GetScreenCRC routine of FIG. 13B.
Figure 14B:
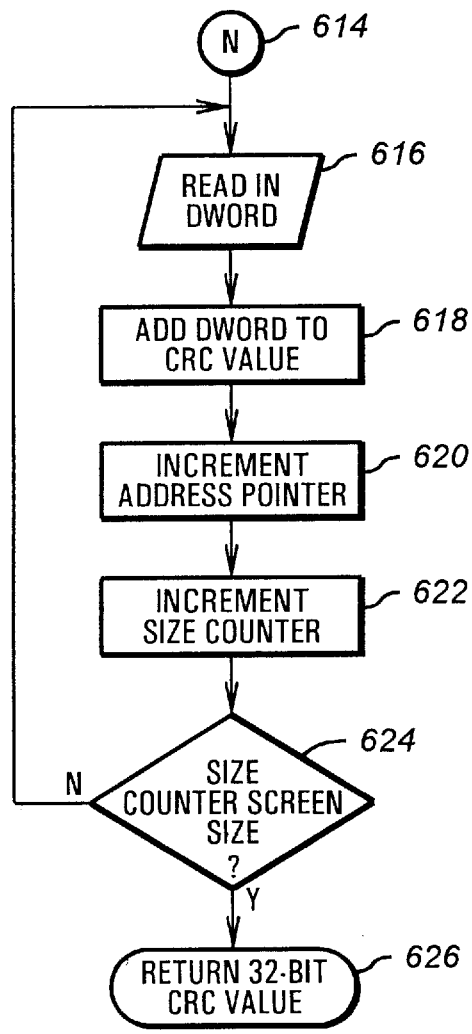

Turning now to FIGS. 14A and 14B, the video DL VxD function Get_Screen_CRC is shown in more detail. Starting from step 600, the routine of FIG. 14A proceeds to step 602 where it receives a number of pixels in double words (Dwords) for the entire screen. From step 602, the routine of FIG. 14A then receives the physical address at the start of the video memory in step 604. Next, the routine of FIG. 14A converts the physical memory address to a linear memory address using a virtual memory management service in step 606. From step 606, the routine of FIG. 14A sets a size counter to zero in step 608 and sets a memory pointer to the first location which is the top of the screen in step 610. From step 610, the routine of FIG. 14A sets the CRC to zero and step 612. From step 612, the routine of FIG. 14A proceeds to step 616 via an N connector 614.

Turning now to FIG. 14B, from the N connector 614 of FIG. 14A, the routine proceeds to step 616 where it reads in the double word. The double word read in step 616 is added to the CRC value in step 618. From step 618, the routine increments the address pointer in step 620 and increments the size counter in step 622. From step 622, the routine of FIG. 14B checks if the size counter has reached a screen size limit in step 624. If not, the routine of FIG. 14B loops back to step 616 to continue the CRC testing process. Alternatively in the event that the size counter has reached the screen size limit in step 624, the routine of FIG. 14B returns a 32 bit CRC value to the caller routine in step 626 and exits.

Figure 15A:
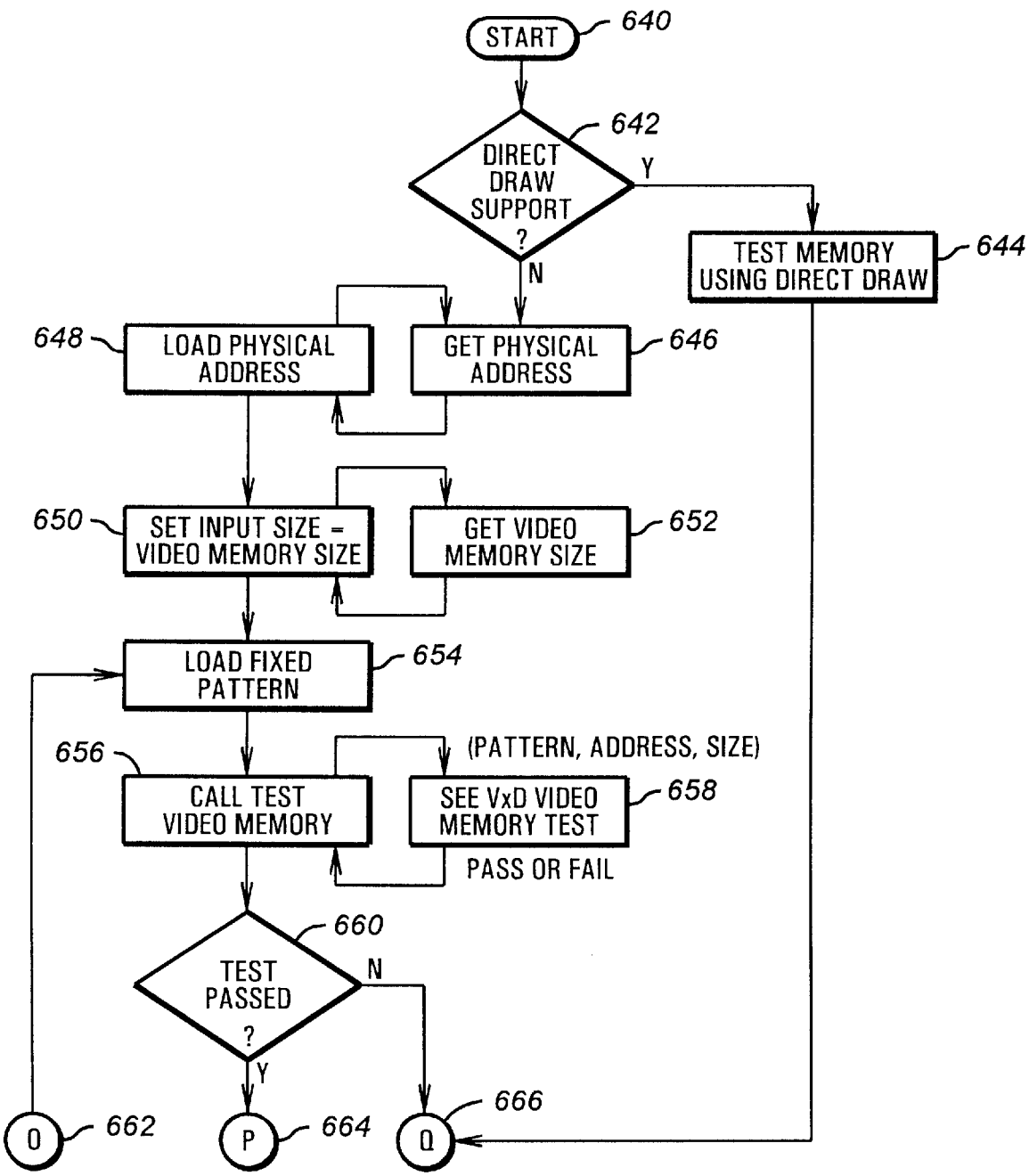
FIGS. 15A and 15B are flowcharts illustrating in detail a fixed pattern video memory test for the routine of FIG. 12A.
Figure 15B:
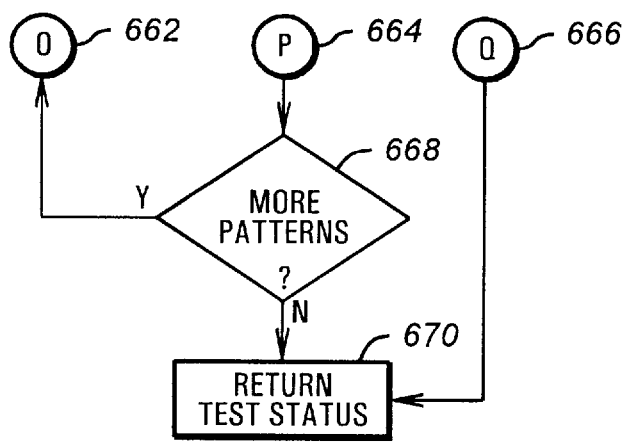

Turning now to FIGS. 15A and 15B, the routine to perform a fixed pattern video memory test is shown in more detail. From step 640 of FIG. 15A, the routine proceeds to step 642 where it checks if support for Direct Draw routines are available. From 642, in the event that Direct Draw routines are supported, the routine proceeds from step 642 to step 644 to perform the memory test using the Direct Draw routines. Next, from step 644, the routine proceeds to step 670 of FIG. 15B via a Q connector 666.

Alternatively, in the event that Direct Draw routines are not supported in step 642, the routine of FIG. 15A proceeds from step 642 to step 646 where it obtains the physical address and loads the physical address in step 648. From step 648, the routine proceeds to step 650 where it sets the input memory size to the video memory size. The video memory size is determined in step 652.

From step 650, the routine proceeds to step 654 where it loads a fixed pattern into the memory to be tested and calls a test video memory routine in step 656. The test video memory routine of step 656 in turn calls various VxD memory tests in step 658. These tests include pattern, address and size consideration. The routine of step 658 in turn generates a pass or fail indicator to the test video memory of step 656. From step 656, the routine proceeds to step 660 where it checks for the result of the tests performed in step 658. In the event of a failure, the routine of FIG. 15A proceeds to step 670 via the connector Q 666. Alternatively, in the event that the test was successful in step 660, the routine proceeds to step 668 via a P connector 664.

Turning now to FIG. 15B, from the P connector 664, the routine checks to see if additional test patterns are to be displayed in step 668. If so, the routine jumps back to step 654 via an O connector 662. Alternatively, in the event that all patterns have been tested in step 668, the routine exits FIG. 15B via step 670 and returns the test status and results.

Figure 16:
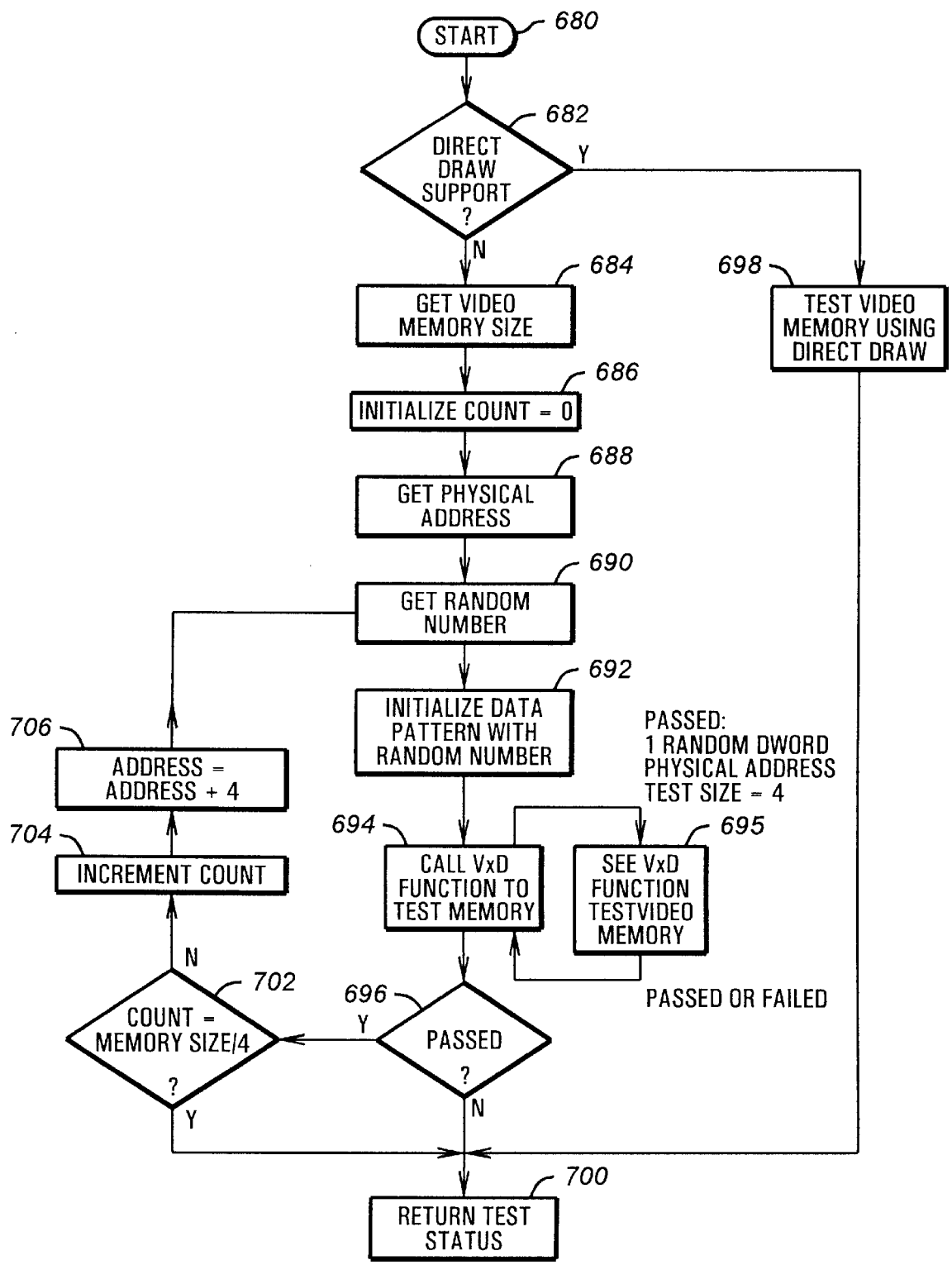
FIG. 16 is a flowchart illustrating in detail a random pattern video memory test for the routine of FIG. 12A.

Turning now to FIG. 16, a random pattern test for the video memory is shown in more detail. In FIG. 16, from step 680, the routine proceeds to step 682 where it checks if Direct Draw routines are supported. If Direct Draw routines are not supported, the routine proceeds from step 682 to step 684 where it obtains the video memory size. Furthermore, in step 686, the routine initializes a count to zero and obtains a physical address in step 688. From step 688, the routine generates a random number in step 690 and initializes the data pattern with a random number in step 692. From step 692, the routine calls a VxD function to test the video memory in step 694. The VxD function called in step 694 in turn jumps to step 695 to execute two test video memory functions, as illustrated in FIGS. 17A and 17B below.

From step 694, the routine proceeds to step 696 where it checks if the video memory is functional. If not, the routine proceeds to step 700 where it returns an error in the test status indicator. Alternatively from step 696, in the event that the video memory passes the video memory test, the routine proceeds from step 696 to step 702 where it checks if the count has reached memory size divided by four. If so, the video memory test is completed and the routine proceeds from step 702 to step 700 to exit the video memory test of FIG. 16. Alternatively, in the event that additional memory tests need to be performed, the routine proceeds from step 702 to step 704 where it increments the count. From step 704, the routine proceeds to step 706 where it increments the address count by four before looping back to step 690 to continue the random pattern test for the video memory.

Figure 17A:
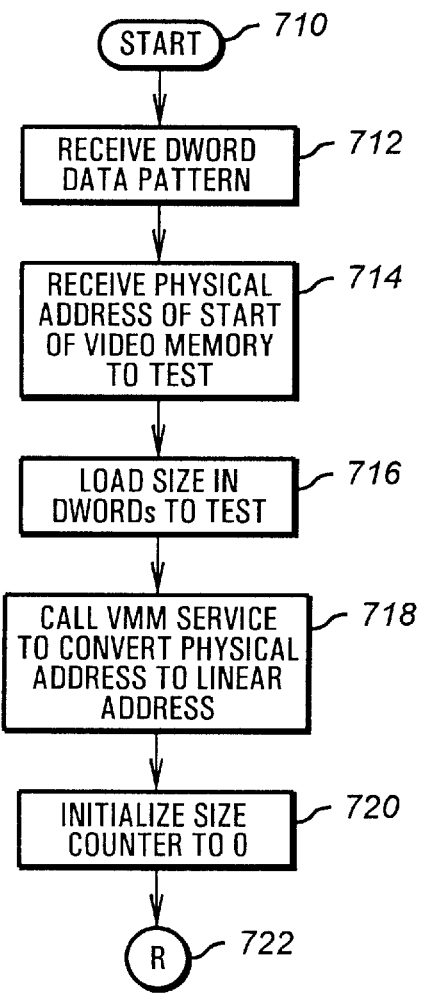
FIGS. 17A and 17B are flowcharts illustrating the process for testing video memory of FIG. 16.
Figure 17B:
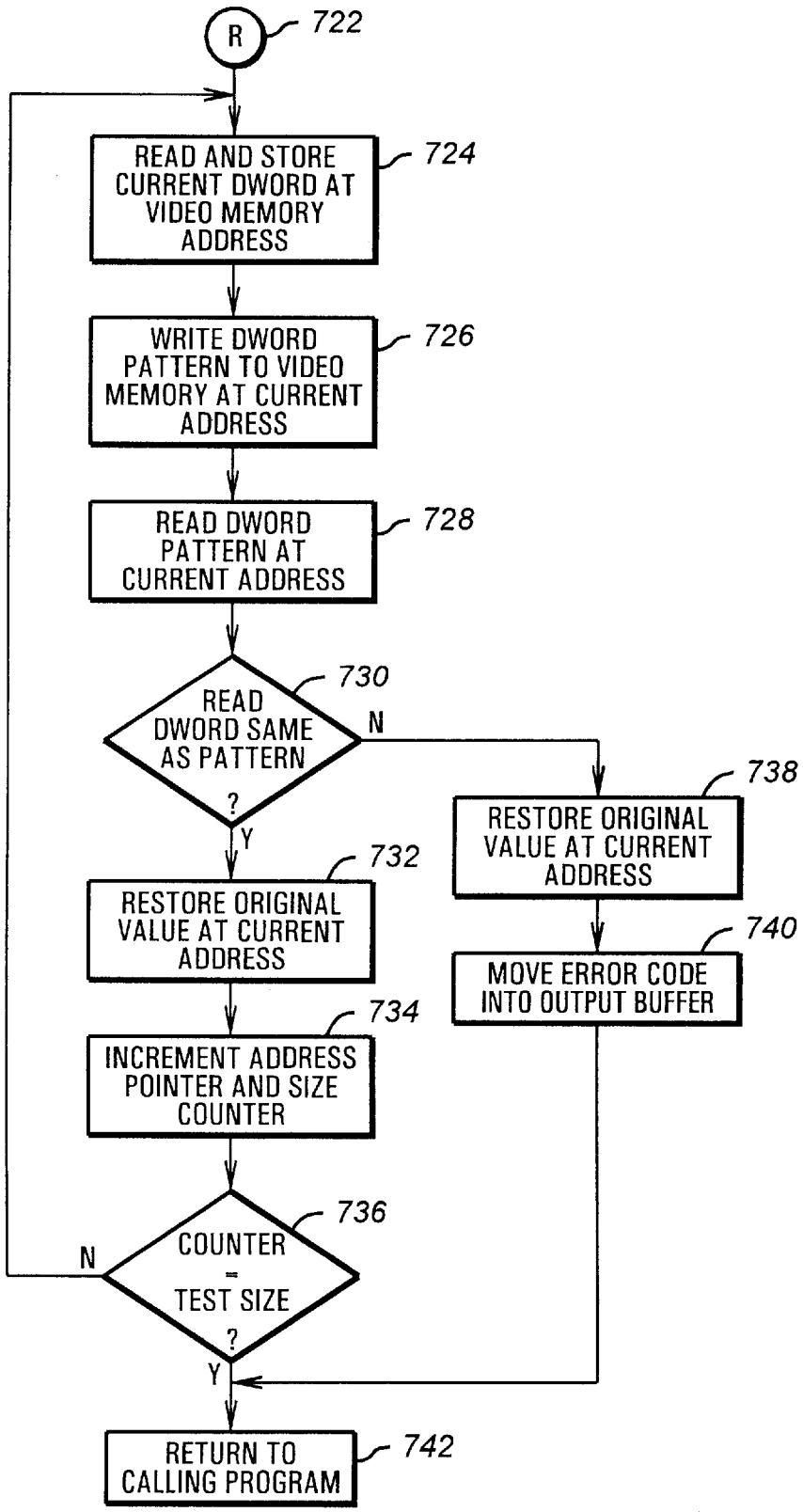

Turning now to FIGS. 17A and 17B, the video diagnostic VxD function for testing the video memory is shown in more detail. In FIG. 17A, from the start step 710, the routine proceeds to step 712 where it receives a double word (D-word) data pattern. Next, in step 714, the routine receives a physical address of the start of the video memory to be tested. From step 714, the routine proceeds to step 716 where it loads the memory size in D-words to be tested. Next, the routine proceeds from step 716 to step 718 where it calls a virtual memory manager service routine to convert the physical address to a linear address. From step 718, the routine proceeds to step 720 where it initializes the size counter to 0. From step 720 of FIG. 17A, the routine proceeds to step 724 of FIG. 17B via an R connector 722.

Turning now to FIG. 17B, from the R connector 722, the routine proceeds to step 724 to read and store the current double word at the video memory address. Next, in step 726, the routine writes the double word pattern into the video memory at the current address. From step 726, the routine proceeds to step 728 where it reads the double word pattern at the current address. Next, in step 730, the routine checks if the double word read in step 728 matches the double word written in step 726. If so, the routine proceeds to step 732 where it restores the original value of the current address. From step 732, the routine proceeds to step 734 where it increments the address pointer in the size counter. From step 734, the routine then proceeds with step 736 where it checks if the counter matches the test size. If not, the routine loops back from step 736 to step 724 to continue the video memory testing process. Alternatively, in the event that the counter has reached a test size number in step 736, the routine proceeds to step 742 where it returns to the calling program to exit FIG. 17B.

In step 730, in the event that the double word read in step 728 does not match the double word written in step 726, the routine of FIG. 17B proceeds to step 730 where it restores the original value of the current address in step 738. Furthermore, the routine of FIG. 17B moves an error code into an output buffer in step 740 to eventually be displayed to the user to indicate error. From step 740, the routine then proceeds to step 742 where it returns to the calling program and exits FIG. 17B.

Figure 18:
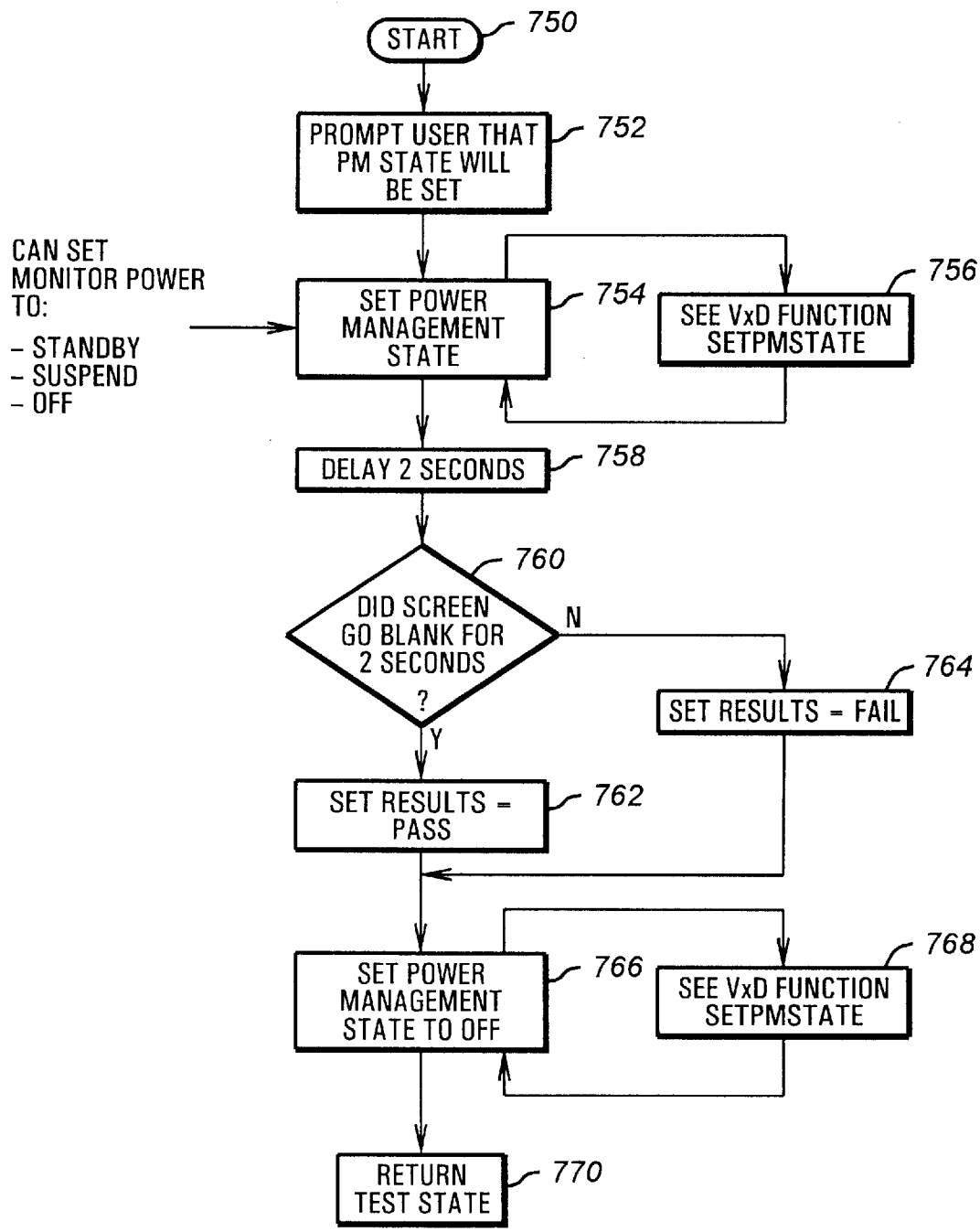
FIG. 18 is a flowchart illustrating a power management diagnostic library module of FIG. 12A.

Referring now to FIG. 18, a routine to perform power management tests is shown in detail. The routine of FIG. 18 performs a test for standby, suspend or power management off modes. Starting in step 750, the routine of FIG. 18 proceeds to step 752 where it prompts the user to indicate that the power management state will be set. Furthermore, in step 754, the routine proceeds to set the power management state which includes a standby state, a suspend state or an off state. Step 754 proceeds to call a VxD function to set the power management step state in step 756, as further illustrated in FIG. 19. From step 754, the routine of FIG. 18 proceeds to step 758 where it delays for two seconds before it proceeds to step 760. In step 760, the routine of FIG. 18 checks if the screen is blank for two seconds. In step 760, if the screen went blank for two seconds, the routine proceeds from step 760 to step 762 where it sets the result to indicate success in power management testing. Alternatively, in step 760, in the event that the screen did not go blank for two seconds, the routine proceeds to step 764 where it indicates a failure.

From step 762 or step 764, the routine of FIG. 18 proceeds to step 766 where it sets the power management state to on. Within the step 766, the routine calls the VxD function set PM state in step 768. Once the routine of FIG. 18 has completed the setting of the power management state in step 766, the routine of FIG. 18 exits in step 770 and returns to test status to the calling routine.

Figure 19:
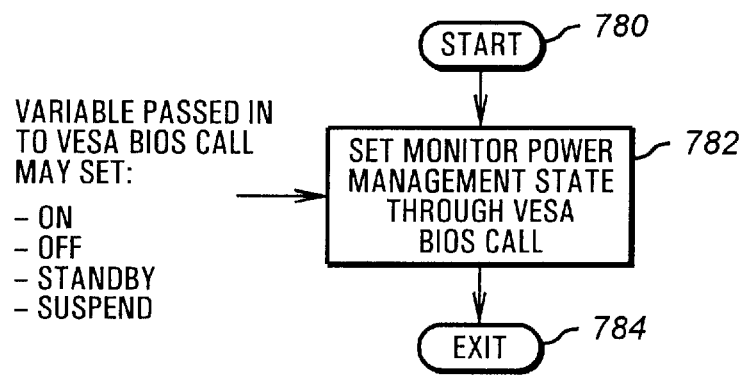
FIG. 19 is a flowchart illustrating a set power state diagnostic library module of FIG. 12A.

Referring now to FIG. 19, the VxD function Set_PM_State is shown. In FIG. 19, from the start step 780, the routine proceeds to step 782 where it sets the monitor power management state through various VESA BIOS calls. The VESA BIOS calls include the setting of the power management state to an on state, an off state, a standby state or a suspend state. Once the state has been set in step 782, the routine of FIG. 19 exits in step 784.

Thus, as discussed above, the present invention for testing components of the multi-tasking computer system obtains a memory block and sends a request to a memory virtual device driver (VxD) to reserve, commit and lock the memory block to a physical memory. It then obtains a physical address for the physical memory and returns the physical address for testing. Next, the apparatus tests the memory block using a number of memory test procedures. After the testing completes, the apparatus decommits and unlocks the physical memory before it traverses to the next entry of the chain. This process is repeated until all entries in the virtual memory chain have been tested. The apparatus also tests the video memory by generating a pattern, writing the pattern to the video memory; reading the content of the video memory and comparing the pattern against the content of the video memory. In the event that the content of the video memory differs from the pattern, the apparatus indicates a defective video display system and otherwise indicates a good video display system.

Thus, the present invention provides a cost effective and rapid system for testing main memory. Furthermore, the present invention provides an effective video system test for quickly achieving the adjustments required in producing an aligned and calibrated monitor. All of this is accomplished in a fraction of the time required by human operators, and with a level of accuracy and repeatability not heretofore possible. Measurements taken during the alignment/calibration cycle also assist in objectively controlling the quality control/assurance, production deviation analysis, and documentation for the system user.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for testing components of a multi-tasking computer system with a virtual memory chain, said method comprising:
   (a) obtaining a memory block having a memory base address and a memory base length for a current entry in the virtual memory chain;
   (b) sending a request to a memory virtual device driver (VxD) to reserve, commit and lock said memory block to a physical memory;
   (c) testing said memory block located at said memory base address and said memory length;
   (d) decommit and unlock said physical memory after step (c);
   (e) traversing to a next entry in said chain; and
   (f) repeating steps (a)–(e) until all entries in said virtual memory chain have been tested.

2. The method of claim 1, wherein step (a) further comprises the step of checking for a valid range for said memory block.

3. The method of claim 1, wherein step (c) further comprises the step of selecting a memory read/write/check test, a memory noise test, a random pattern memory test, a random address memory test, or an address memory test.

4. The method of claim 3, wherein said read/write/check test further comprises the steps of:
   writing a known pattern into said memory block;
   waiting for a predetermined period;
   comparing the result of said writing step with a predetermined bit pattern; and
   if said comparing step indicates a difference, converting said base address into a physical address and indicating a memory error.

5. The method of claim 4, wherein said known pattern include patterns selected from a noise test, a random pattern test, a random address test, an address test, a marching test, and a walking zeros and ones test.

6. The method of claim 1, wherein step (b) further comprises the steps of
   generating a number of virtual memory pages spanned by said request;
   reserving said pages of virtual memory;
   committing said virtual memory to a physical memory;
   locking said virtual memory to said physical memory;
   obtaining a physical address of said physical memory; and
   returning said physical address for testing.

7. The method of claim 1, wherein step (d) further comprises the steps of:
   unlocking said virtual memory from said physical memory; and
   freeing said physical memory.

8. The method of claim 1, wherein said computer system has a video display system with a video memory, said method further comprising the step of testing for display modes of said video display system.

9. The method of claim 1, wherein said computer system has a video display system with a video memory and graphics accelerator circuitry, said method further comprising the step of testing one or more accelerator functions.

10. The method of claim 1, wherein said computer system has a video display system with a video memory, said method further comprising the step of interacting with a user.

11. The method of claim 10, wherein said interacting step further comprises the steps of:
   generating a random number;
   obtaining data from said user;
   comparing said data with said random number; and
   if said data differs from said random number generator, indicating failure, and otherwise indicating success.

12. The method of claim 1, wherein said computer system has a video display system with a video memory, said method further comprising the steps of:
   generating a cyclic redundancy code for said video memory;
   comparing said cyclic redundancy code with a predetermined value; and
   if said cyclic redundancy code differs from said predetermined value, indicating failure, and otherwise indicating success.

13. The method of claim 12, wherein said cyclic redundancy code is determined using a Direct Draw Driver.

14. The method of claim 12, wherein said cyclic redundancy code is determined using the steps of:

(a) accessing a video memory location;

(b) adding the content of said memory location to said cyclic redundancy code; and (c) repeating steps (a) and (b) until all video memory locations have been accessed.

15. The method of claim 1, wherein said computer system has a video display system with a video memory, said method further comprising the steps of:

generating a random pattern;

writing said random pattern to said video memory;

reading the content of said video memory;

comparing said random pattern to the content of said video memory; and if the content of said video memory differs from said random pattern, indicating an error and otherwise indicating a success.

16. The method of claim 1, wherein said computer system has a video display system with a video memory, said method further comprising the steps of:

retrieving a predetermined pattern;

writing said predetermined pattern to said video memory;

reading the content of said video memory;

comparing said predetermined pattern to the content of said video memory; and if the content of said video memory differs from said predetermined pattern, indicating an error and otherwise indicating a success.

17. The method of claim 1, wherein said computer system has a video display system with a power management mode, said method further comprising the steps of:

setting said power management state;

delaying for a predetermined period;

checking for a blank video display; and if said video display is not blank, indicating failure and otherwise indicating success.

18. The method of claim 17, wherein said setting step sets said power management state through a VESA BIOS call.

19. The method of claim 1, wherein said computer system has a video display system with a video memory, said method further comprising the step of selecting a mode test, an accelerator test, a video memory test, or a power management test.

20. A method for testing components of a multi-tasking computer system with a virtual memory chain and a video display system with a video memory, said method comprising:

(a) obtaining a memory block having a memory base address and a memory base length for the current entry in the virtual memory chain;

(b) sending a request to a memory virtual device driver (VxD) to reserve, commit and lock said memory block to a physical memory, further including the steps of:

generating a number of virtual memory pages spanned by said request;

reserving said pages of virtual memory;

committing said virtual memory to a physical memory;

locking said virtual memory to said physical memory;

obtaining a physical address of said physical memory; and returning said physical address for testing;

(c) testing said memory block located at said memory base address and said memory length;

(d) decommit and unlock said physical memory after step (c);

(e) traversing to the next entry in said chain;

(f) repeating steps (a)–(e) until all entries in said virtual memory chain have been tested;

(g) if step (c) detected a memory failure, indicating a memory failure and otherwise indicating a good memory; and (h) testing said video memory, further comprising the steps of:

generating a pattern;

writing said pattern to said video memory;

reading the content of said video memory;

comparing said pattern to the content of said video memory; and if the content of said video memory differs from said pattern, indicating a defective video display system and otherwise indicating a good video display system.

21. A program storage device having a computer readable code embedded therein for testing components of a multi-tasking computer system with a virtual memory chain, said program storage device comprising:

a first code for obtaining a memory block having a memory base address and a memory base length for a current entry in the virtual memory chain;

a second code for sending a request to a memory virtual device driver (VxD) to reserve, commit and lock said memory block to a physical memory;

a third code for testing said memory block located at said memory base address and said memory length;

a fourth code for decommit and unlock said physical memory; and a fifth code for traversing to a next entry in said chain.

22. The program storage device of claim 21, wherein said first code further comprises a code for checking for a valid range for said memory block.

23. The program storage device of claim 21, wherein said third code further comprises a code for selecting a memory read/write/check test, a memory noise test, a random pattern memory test, a random address memory test, or an address memory test.

24. The program storage device of claim 23, wherein said read/write/check test further comprises:

a seventh code for writing a known pattern into said memory block;

a eighth code for waiting for a predetermined period;

a ninth code for comparing the result of said seventh code with a predetermined bit pattern; and a tenth code for converting said base address into a physical address and indicating a memory error if said comparing code indicates a difference.

25. The program storage device of claim 24, wherein said known pattern include patterns selected from a noise test, a random pattern test, a random address test, an address test, a marching test, and a walking zeros and ones test.

26. The program storage device of claim 21, wherein said second code further comprises:

a page count code for generating a number of virtual memory pages spanned by said request;

a reservation code for reserving said pages of virtual memory;

a commit code for committing said virtual memory to a physical memory;

a lock code for locking said virtual memory to said physical memory; and an address code for obtaining a physical address of said physical memory.

27. The program storage device of claim 21, wherein said fourth code further comprises:

an unlock code for unlocking said virtual memory from said physical memory; and an unallocate code for freeing said physical memory.

28. The program storage device of claim 21, wherein said computer system has a video display system with a video memory, said program storage device comprising a code for testing display modes of said video display system.

29. The program storage device of claim 21, wherein said computer system has a video display system with a video memory and graphics accelerator circuitry, said program storage device further comprising a code for testing one or more accelerator functions.

30. The program storage device of claim 21, wherein said computer system has a video display system with a video memory, said program storage device comprising a code for interacting with a user.

31. The program storage device of claim 30, wherein said interacting code further comprises:

a random number code for generating a random number;

a data input code for receiving data from said user;

a comparator code for comparing said data with said random number; and a display code for indicating failure if said data differs from said random number generator and otherwise indicating success.

32. The program storage device of claim 21, wherein said computer system has a video display system with a video memory, said program storage device further comprising:

a code generator for generating a cyclic redundancy code for said video memory;

a comparator code for comparing said cyclic redundancy code with a predetermined value; and a display code for indicating failure if said cyclic redundancy code differs from said predetermined value and otherwise indicating success.

33. The program storage device of claim 32, wherein said cyclic redundancy code is determined using a Direct Draw Driver.

34. The program storage device of claim 32, wherein said code generator further comprises:

a code for accessing the content of a video memory location; and an adder code for adding the content of said video memory location to said cyclic redundancy code.

35. The program storage device of claim 21, wherein said computer system has a video display system with a video memory, said program storage device further comprising:

a code for generating a random pattern;

a code for writing said random pattern to said video memory;

a code for reading the content of said video memory;

a code for comparing said random pattern to the content of said video memory; and a display code for indicating an error and otherwise indicating a success.

36. The program storage device of claim 21, wherein said computer system has a video display system with a video memory, said program storage device further comprising:

a code for retrieving a predetermined pattern;

a code for writing said predetermined pattern to said video memory;

a code for reading the content of said video memory;

a code for comparing said predetermined pattern to the content of said video memory; and a code for indicating an error if the content of said video memory differs from said predetermined pattern and otherwise indicating a success.

37. The program storage device of claim 21, wherein said computer system has a video display system with a power management mode, said program storage device further comprising:

a code for setting said power management state;

a code for delaying for a predetermined period;

a code for checking for a blank video display; and a display code for indicating failure if said video display is not blank and otherwise indicating success.

38. The program storage device of claim 37, wherein said setting code sets said power management state through a VESA BIOS call.

39. The program storage device of claim 21, wherein said computer system has a video display system with a video memory, said program storage device further comprising a code for selecting a mode test, an accelerator test, a video memory test, or a power management test.

* * * * *